(12) United States Patent
Liu et al.

(10) Patent No.: US 12,123,713 B2
(45) Date of Patent: Oct. 22, 2024

(54) HOUSING, HOUSING ASSEMBLY, MECHANICAL ARM, AND ROBOT OF MECHANICAL EQUIPMENT

(71) Applicant: SHENZHEN YUEJIANG TECHNOLOGY CO., LTD., Shenzhen (CN)

(72) Inventors: Peichao Liu, Shenzhen (CN); Yepeng Li, Shenzhen (CN); Rui Huang, Shenzhen (CN); Zheng Ju, Shenzhen (CN); Xulin Lang, Shenzhen (CN)

(73) Assignee: Shenzhen Yuejiang Technology Co., Ltd., Shenzhen (CN)

( * ) Notice: Subject to any disclaimer, the term of this patent is extended or adjusted under 35 U.S.C. 154(b) by 349 days.

(21) Appl. No.: 17/213,163

(22) Filed: Mar. 25, 2021

(65) Prior Publication Data
US 2021/0255350 A1    Aug. 19, 2021

Related U.S. Application Data

(63) Continuation-in-part of application No. PCT/CN2019/106043, filed on Sep. 17, 2019.

(30) Foreign Application Priority Data

Aug. 2, 2019  (CN) .......................... 201921252998.9
Aug. 2, 2019  (CN) .......................... 201921258844.0
Aug. 2, 2019  (CN) .......................... 201921265549.8

(51) Int. Cl.
*G01B 7/02*   (2006.01)
*B25J 9/16*   (2006.01)
(Continued)

(52) U.S. Cl.
CPC .............. *G01B 7/023* (2013.01); *B25J 9/161* (2013.01); *B25J 9/1651* (2013.01); *B25J 9/1666* (2013.01);
(Continued)

(58) Field of Classification Search
CPC .. G01B 7/023; G01B 7/14; B25J 9/161; B25J 9/1651; B25J 9/1666; B25J 9/1694;
(Continued)

(56) References Cited

U.S. PATENT DOCUMENTS 4,661,797 A    4/1987  Schmall
5,988,971 A   11/1999  Fossey et al.
(Continued)

FOREIGN PATENT DOCUMENTS

CA    2827699 A1    3/2014
CN    1220931 A     6/1999
(Continued)

OTHER PUBLICATIONS

International search report issued for counterpart Chinese patent application No. PCT/CN2019/106043 mailed on Apr. 24, 2020., 2 pgs.
(Continued)

*Primary Examiner* — Amy He
(74) *Attorney, Agent, or Firm* — Loza & Loza, LLP; Michael Fedrick

(57) ABSTRACT

A sensing circuit (51), a logic circuit board, a joint control board, a main controller board and a robot (400). The sensing circuit (51) comprises a connecting terminal (514) and a detection circuit (210). The connecting terminal (514) is configured to be coupled with the electrode (120) disposed on a housing (100) of a mechanical equipment; the detection circuit (210) is coupled to the connecting terminal (514) so as to detect the distance between the electrode (120) and the external conductor or a change of the distance between the electrode (120) and the external conductor according to the capacitance between the electrode and the external conductor or a change of the capacitance between the electrode (120) and the external conductor, thereby obtaining an
(Continued)

electrical signal representing the distance between the electrode (120) and the external conductor or a change of the distance between the electrode (120) and the external conductor.

20 Claims, 15 Drawing Sheets

(51) Int. Cl.
  *B25J 13/08*    (2006.01)
  *B25J 19/02*    (2006.01)
  *G01B 7/14*    (2006.01)
  *G01D 5/24*    (2006.01)
  *G01D 5/241*    (2006.01)
  *G01R 21/00*    (2006.01)
  *G01R 22/02*    (2006.01)
  *G01V 3/08*    (2006.01)
  *H03J 1/00*    (2006.01)

(52) U.S. Cl.
  CPC .......... *B25J 9/1694* (2013.01); *B25J 13/086* (2013.01); *B25J 13/089* (2013.01); *B25J 19/02* (2013.01); *G01B 7/14* (2013.01); *G01D 5/24* (2013.01); *G01D 5/241* (2013.01); *G01R 21/00* (2013.01); *G01R 22/02* (2013.01); *G01V 3/088* (2013.01); *H03J 1/005* (2013.01); *H03J 2200/10* (2013.01); *H03J 2200/29* (2013.01)

(58) Field of Classification Search
  CPC ........ B25J 13/086; B25J 13/089; B25J 19/02; B25J 9/1676; B25J 19/027; G01D 5/24; G01D 5/241; G01D 5/243; G01D 5/2417; G01V 3/088; G05B 2219/37284; G05B 19/0423; G05B 2219/25257; H03K 17/955
  See application file for complete search history.

(56) References Cited

U.S. PATENT DOCUMENTS

| | | | |
|---|---|---|---|
| 10,213,923 B2* | 2/2019 | Corkum | ............... B25J 9/1676 |
| 2004/0187593 A1 | 9/2004 | Okada | |
| 2008/0125893 A1 | 5/2008 | Tilove et al. | |
| 2008/0306628 A1 | 12/2008 | Ng-Thow-Hing et al. | |
| 2017/0066130 A1 | 3/2017 | Corkum et al. | |
| 2017/0257094 A1 | 9/2017 | Schupp et al. | |
| 2018/0236667 A1 | 8/2018 | Gombert et al. | |
| 2019/0145798 A1* | 5/2019 | Kamiya | ............... B25J 9/1694 700/258 |
| 2021/0237271 A1 | 8/2021 | Liu et al. | |
| 2021/0255350 A1 | 8/2021 | Liu et al. | |
| 2022/0170974 A1 | 6/2022 | Dai et al. | |

FOREIGN PATENT DOCUMENTS

| | | |
|---|---|---|
| CN | 1788859 A | 6/2006 |
| CN | 102015223 A | 4/2011 |
| CN | 201903787 U | 7/2011 |
| CN | 103299776 A | 9/2013 |
| CN | 104765363 A | 7/2015 |
| CN | 105225985 A | 1/2016 |
| CN | 205996974 U | 3/2017 |
| CN | 106695889 A | 5/2017 |
| CN | 106716838 A | 5/2017 |
| CN | 106926239 A | 7/2017 |
| CN | 206296915 U | 7/2017 |
| CN | 107000214 A | 8/2017 |
| CN | 206499476 U | 9/2017 |
| CN | 1007229277 A | 10/2017 |
| CN | 107436159 A | 12/2017 |
| CN | 206818356 U | 12/2017 |
| CN | 206946502 U | 1/2018 |
| CN | 108241373 A | 7/2018 |
| CN | 108602187 A | 9/2018 |
| CN | 108637460 A | 10/2018 |
| CN | 109382823 A | 2/2019 |
| CN | 109397272 A | 3/2019 |
| CN | 109544872 A | 3/2019 |
| CN | 109708785 A | 5/2019 |
| CN | 109716652 A | 5/2019 |
| CN | 109773764 A | 5/2019 |
| CN | 109773832 A | 5/2019 |
| CN | 110315556 A | 10/2019 |
| CN | 112605998 A | 4/2021 |
| DE | 10061351 A1 | 6/2002 |
| DE | 102010047198 A1 | 4/2012 |
| EP | 0158593 A1 | 10/1985 |
| EP | 3246137 A1 | 11/2017 |
| EP | 3258602 A1 | 12/2017 |
| JP | H07241790 A | 9/1995 |
| JP | 2010010116 A | 1/2010 |
| WO | 2017191573 A1 | 11/2017 |
| WO | 2019030042 A1 | 2/2019 |

OTHER PUBLICATIONS

Dean-Leon, Emmanuel et al. "Robotic Technologies for Fast Deployment of Industrial Robot Systems", IEEE, 2016, pp. 6900-6907.
Yu, Yibo, "Resonance-Based Capacitive Sensing Using LDC2114", Application Report SNOA970, Texas Instruments Incorporated, Dec. 2017, 8 pgs.

* cited by examiner

HOUSING, HOUSING ASSEMBLY, MECHANICAL ARM, AND ROBOT OF MECHANICAL EQUIPMENT

CROSS-REFERENCE TO RELATED APPLICATIONS

The present disclosure is a continuation-in-part of PCT Patent Application No. PCT/CN2019/106043, with an international filing date of Sep. 17, 2019, which claims priority to Chinese Patent Application Nos. 201921258844.0, 201921252998.9, and 201921265549.8, which were filed with the China National Intellectual Property Administration on Aug. 2, 2019, and were entitled "robot electronic skin and robot," "non-contact electronic skin sensing circuit and device," and "communication layout structure of electronic skin system," respectively. The disclosures of the foregoing applications are incorporated herein by reference in their entirety.

TECHNICAL FIELD

The present disclosure relates to the field of mechanical equipment, and in particular relates to a housing, a housing assembly, a mechanical arm and a robot of mechanical equipment.

BACKGROUND

Currently, the main method for mechanical equipment to detect approaching objects is to make physical contact with the object through housing. Taking the contact-type resistive housing as an example, the resistive housing sends contact signals that represent the deformation by relying on the deformation of housing caused by contact of approaching objects with the robot.

However, when approaching objects are not in direct contact with the electronic skin, the mechanical equipment may not realize the non-contact distance detection of the approaching objects, and when the mechanical equipment is in motion, the contact of mechanical equipment and the object is prone to cause damage to the object.

SUMMARY

The present disclosure mainly provides a housing, a housing assembly, a mechanical arm and a robot of mechanical equipment, to solve the technical problem that mechanical equipment may not achieve the detection of non-contact distance of approaching objects.

To solve the above technical problems, one technical solution adopted in the present disclosure is to provide a housing of mechanical equipment. The housing of the mechanical equipment comprises a main body and an electrode, wherein the electrode is provided on the main body and comprises a sensing area and a connection area that are interconnected, the sensing area of the electrode and a conductor that approaches the sensing area generate a capacitor, and the connection area of the electrode is configured to transmit electrical signals representing the capacitance or a change of the capacitance to a peripheral circuit.

To solve the above technical problems, another technical solution adopted in the present disclosure is to provide a housing assembly of mechanical equipment. The housing assembly of the mechanical equipment comprises a housing and a detection circuit, while the detection circuit is arranged on the housing and is connected with a connection area of the electrode, and is configured to transmit electrical signals representing the capacitance or a change in the capacitance to a peripheral circuit.

To solve the above technical problems, another technical solution adopted in the present disclosure is to provide a mechanical arm. The mechanical arm has a main part, at least one joint module connected to the main part, and a detection circuit: the main part and/or the joint module comprise the foregoing housing, and the detection circuit is electrically connected with the electrode.

To solve the above technical problems, another technical solution adopted in the present disclosure is to provide a robot. The robot comprises a base and at least one mechanical arm. The mechanical arm comprises a main part, at least one joint module and a detection circuit connected to the main part: the main part and/or the joint module comprise the foregoing housing, and the detection circuit is electrically connected with the electrode.

To solve the above technical problems, another technical solution adopted in the present disclosure is to provide a housing of mechanical equipment, comprising a main body and an electrode, wherein the electrode is arranged on the main body, and the electrode and a conductor that approaches the electrode generate a capacitance, and the electrode is configured to be connected with a capacitance detection circuit or a charge detection circuit.

The present disclosure may achieve the following beneficial effects: for the housing provided in this disclosure, different from the prior art, the electrode is arranged on the main body, and the sensing area of the electrode and a conductor that approaches the sensing area generate a capacitor, and the connection area that is interconnected with the sensing area is configured to transmit electrical signals representing the capacitance or a change in the capacitance to a peripheral circuit, to obtain the distance between the electrode and the conductor or a change of the distance between the electrode and the conductor, so that the housing of the mechanical equipment may sense the approaching of an external conductor, to achieve non-contact distance sensing.

BRIEF DESCRIPTION OF THE DRAWINGS

In order to describe the technical solutions in the embodiments of the present disclosure or the prior art more clearly, the drawings that need to be used in the description of the embodiments or the prior art will be described briefly. It is obvious that these drawings merely describe some embodiments of the present disclosure. For those of ordinary skill in the art, other drawings may be obtained based on these drawings without creative work.

DETAILED DESCRIPTION

The technical solutions in the embodiments of the present disclosure will be described clearly and completely in conjunction with the appended drawings. Apparently, the embodiments described herein are merely some examples rather than all the embodiments of the present disclosure. All other embodiments obtained by obtained by those of ordinary skill in the art without creative work on the basis of embodiments herein shall fall within the scope of protection of the present disclosure.

The terms "first" "second" and "third" in the embodiments of the present disclosure are merely for descriptive purposes and are not understood to indicate or imply relative importance or to implicitly indicate the number of technical features. Thus, a feature that is defined as "first", "second" and "third" may explicitly or implicitly comprise at least one of these features. In the description of the present disclosure, "multiple" means at least two, e.g., two, three, etc., unless specifically defined otherwise. In addition, the terms "comprise" and "has/have" and any variations of them are intended to cover non-exclusive inclusions. For example, a process, method, system, product, or device that contains a series of steps or units is not restricted to the listed steps or units, but optionally comprises steps or units that are not listed, or optionally comprises other steps or units inherent to those processes, methods, products, or devices.

A reference to an "embodiment" herein implies that a particular feature, structure or characteristic described in combination with an embodiment may be comprised in at least one embodiment of the present disclosure. The term in the specification does not necessarily refer to the same embodiment, nor is it an independent or alternative embodiment mutually exclusive from other embodiments. It is explicitly and implicitly understood by those skill in the art that the embodiments described herein may be combined with other embodiments.

In the present disclosure, the device may be a mechanical equipment. It will be described below taking mechanical equipment as an example.

Figure 1:
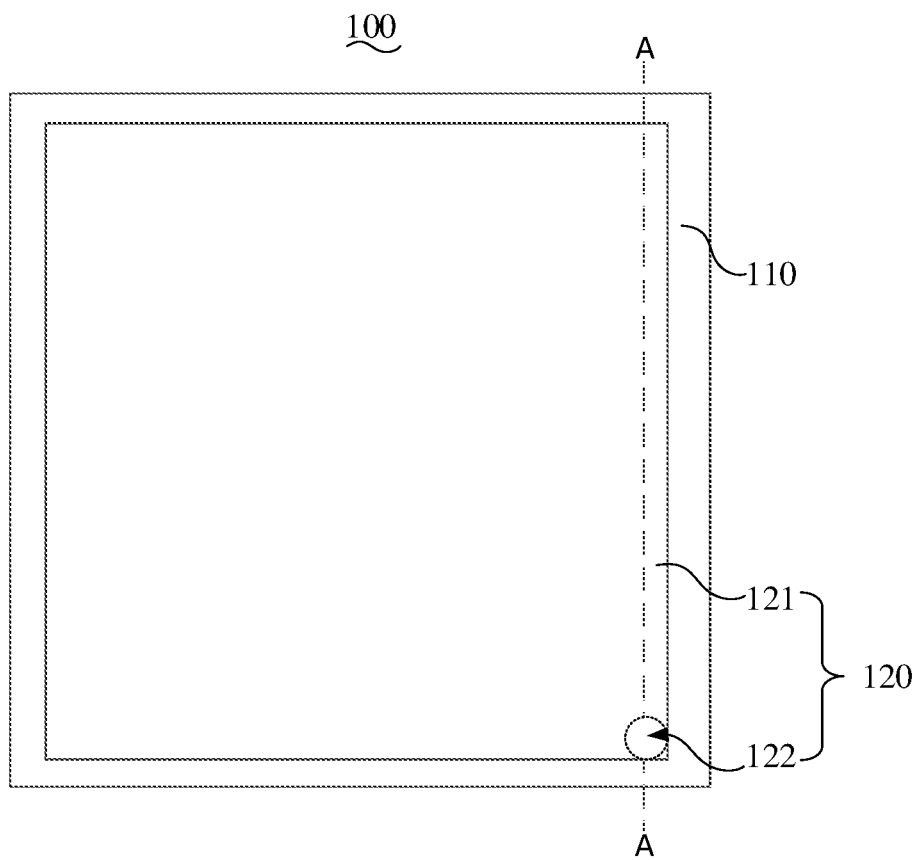
FIG. 1 is a first schematic diagram of an embodiment of a housing of mechanical equipment in the present disclosure.
Figure 2:
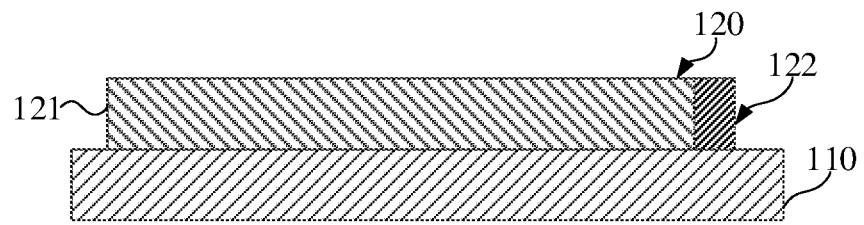
FIG. 2 is a sectional view of the housing shown in FIG. 1 along the A-A direction.

Referring to FIG. 1 and FIG. 2, FIG. 1 is a first schematic diagram of an embodiment of a housing of mechanical equipment in the present disclosure: FIG. 2 is a sectional view of the housing shown in FIG. 1 along the A-A direction.

A housing 100 of a mechanical equipment comprises a main body 110 and an electrode 120.

The main body 110 may be mounted on the outer surface of mechanical equipment and may provide a place attached by the electrode 120.

The electrode 120 is arranged on the main body 110 and comprises a sensing area 121 and a connection area 122 that are connected to each other. The sensing area 121 of the electrode and a conductor that approaches the sensing area 121 generate a capacitance (not shown in the figure), and the connection area 122 of the electrode 120 is configured to transmit electrical signals representing the capacitance or a change in the capacitance to a peripheral circuit.

In FIG. 1, only one electrode 120 arranged on the main body 110 is exemplarily drawn. However, it should be understood that there may be multiple electrodes, in the present disclosure, multiple means two or more. In FIG. 1, the main body 110 is in a square shape, in fact, the main body 110 may also be in other shape, and the shape of main body 110 may be adjusted according to the shape of the mechanical equipment to be mounted.

The number and size of the electrode 120 may be adjusted according to the accuracy requirements of sensing the distance and the change in the distance of the approaching conductor. The size of the main body 110 may also be adjusted according to the size and number of the electrode 120.

Wherein the sensing area 121 of the electrode 120 and the approaching conductor constitute a capacitor. The electrical signals representing the capacitance or a change in the capacitance, for example, may be electrical signals representing the capacitance or a change in the capacitance of capacitor, electrical signals representing the oscillation frequency or a change in the oscillation frequency of capacitor, or electrical signals representing the voltage or a change in the voltage of the capacitor, etc.

The peripheral circuit acquires the electrical signals representing the capacitance or a change in the capacitance, and after processing, the data that reflect the distance between the electrode 120 and the conductor or a change of the distance between the electrode 120 and the conductor may be obtained. The distance between the electrode 120 and the conductor or a change of the distance between the electrode 120 and the conductor means the distance between the electrode 120 and the conductor, or a change of the distance in relative position between the electrode 120 and the conductor, such as "approaching" or "away from". It may be understood that the distance between the electrode 120 and the conductor or a change of the distance between the electrode 120 and the conductor may be used to represent the distance between the approaching conductor and the mechanical equipment (i.e., the electrode 120) or a change of the distance in relative position (i.e. change in distance) between the approaching conductor and the mechanical equipment (i.e., the electrode 120).

In other words, for the housing 100 in this embodiment, since the sensing area 121 of the electrode 120 and a conductor that approaches the sensing area 121 generate a capacitance, on the one hand, it may sense the distance between the approaching conductor and the housing 100, so that the mechanical equipment may make response accordingly to the distance; and on the other hand, it may sense the change in the relative position between the approaching conductor and housing 100. For example, regardless of the distance between the approaching conductor and housing 100, the mechanical equipment will make response accordingly if the distance between the approaching conductor and housing 100 changes quickly.

In this embodiment, for the housing 100 provided, by providing the electrode 120 on the main body 110, the sensing area 121 of the electrode 120 and a conductor that approaches the sensing area 121 generate a capacitance, and the connection area 122 that is connected with the sensing area 121 is configured to transmit the electrical signals representing the capacitance or a change in the capacitance to a peripheral circuit, to obtain the distance between the electrode 120 and the conductor or a change of the distance between the electrode 120 and the conductor, so that the housing 100 of the mechanical equipment may sense the approaching of an external conductor, to achieve non-contact distance sensing.

Optionally, referring to FIG. 2, the electrode 120 covers the outer surface of the body 110, and the shape of the electrode 120 matches with the shape of the outer surface of the main body 110.

The expression "the electrode 120 covers the outer surface of the main body 110" means that, the electrode 120 covers the side of the main body 110 away from the mechanical equipment to facilitate forming a capacitor with an approaching conductor.

The expression "the shape of the electrode 120 matches with the shape of the outer surface of the main body 110" means that, the shape of the side where the electrode 120 is attached to the main body 110 is the same or substantially the same as the shape of the outer surface of the main body 110.

Since the shape of the electrode 120 matches with the shape of the outer surface of the main body 110, the electrode 120 is attached to the outer surface of the main body 110 to achieve a better fixing effect, and may enhance the overall structural stability of the housing 100, improve the performance, and make the housing 100 more beautiful.

Figure 3:
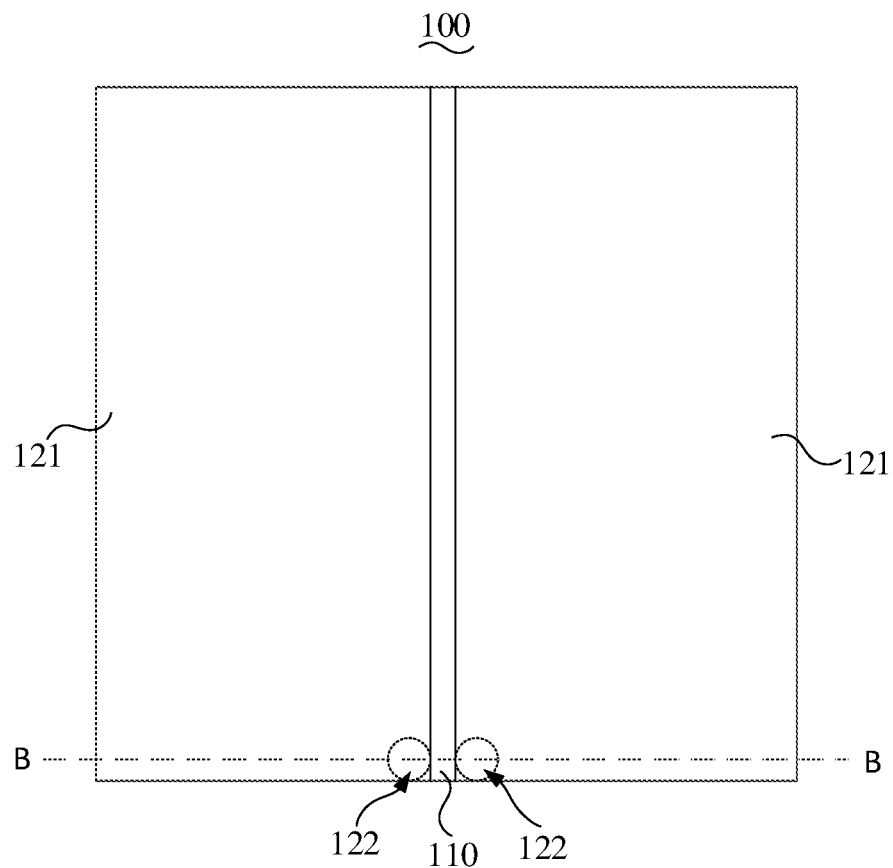
FIG. 3 is a second schematic diagram of an embodiment of a housing of mechanical equipment in the present disclosure.
Figure 4:
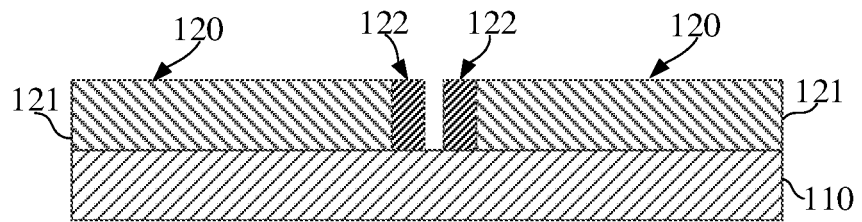
FIG. 4 is a sectional view of the housing shown in FIG. 3 along the B-B direction.

Referring to FIG. 3 and FIG. 4, FIG. 3 is a second schematic diagram of an embodiment of a housing of mechanical equipment in the present disclosure. FIG. 4 is a sectional view of the housing shown in FIG. 3 along the B-B direction.

In this embodiment, there are at least two electrodes 120 that are laid flat on the outer surface of the main body 110, and two adjacent electrodes 120 are separated and insulated from each other.

In FIG. 3, only two electrodes 120 arranged on the main body 110 are exemplarily drawn. However, it should be understood that the number of electrodes 120 may be two or more, for example, three, five or more.

It should be noted that, when the number of electrodes 120 is two or more, the sensing area 121 of each electrode 120 and a conductor that approaches the sensing area 121 generate a capacitance, and each electrode 120 may independently sense the capacitance or a change in the capacitance in the corresponding area of the sensing area 121 of the electrode 120, and the connection area 122 of the electrode 120 is configured to transmit the electrical signals representing the capacitance or a change in the capacitance to a peripheral circuit. Each electrode 120 has one and only one electrical signal representing the capacitance or a change in the capacitance, that is, regardless of which area of the electrode 120 (for example, the upper left corner of the electrode 120 or the lower right corner of the electrode 120) that the approaching conductor is approaching, or which area of an electrode 120 an approaching object 1 covers, the corresponding electrode 120 generates only one electrical signal representing the capacitance or a change in the capacitance.

The expression "laid flat on the outer surface of the main body 110" means that, the electrode 120 is laid flat on the outer surface of the main body 110. By laying the electrode 120 flat on the outer surface of the main body 110, the electrode 120 and the main body 110 may achieve better fit, to facilitate fixation and enhance the sensing effect.

By laying at least two electrodes 120 flat on the outer surface of the main body 110 in different directions, each electrode 120 has one and only one electrical signal representing the capacitance or a change in the capacitance, so that the housing 100 and conductor that can approach the housing 100 from different directions generate the capacitance through the sensing area 121 of the electrode 120 which is arranged disorderly on the main body 110, to sense the approaching of at least two external conductors in different directions, to achieve the identification on the position information of the approaching conductor, which facilitates the mechanical equipment to make different response according to the position information of the approaching conductor.

Optionally, referring to FIG. 3 and FIG. 4, there are at least two electrodes 120 that are laid flat on the outer surface of the main body 110 to enclose the outer surface of the main body 110 together, and both two adjacent electrodes 120 are separated and insulated from each other.

The expression "the electrodes 120 enclose the outer surface of the main body 110 together" means that, at least two electrodes 120 are contained and covered on the outer surface of the main body 110, so that the outer surface of the main body 110 is enclosed by the electrodes 120. Certainly, there may be gaps between the electrodes 120, and the gaps will not affect the sensing of the approaching conductors in various directions by the electrodes 120.

By laying at least two electrodes 120 flat on the outer surface of the main body 110 to enclose the outer surface of the main body 110 together, the housing 100 may make the sensing area 121 of the electrode 120 enclosed on the outer surface of the main body 110 and approaching conductor in various directions to form a capacitor, so that the approaching of the external conductor on the main body 110 in various directions may be sensed.

Further, the size of each electrode 120 may be adjusted according to the accuracy requirement of distance sensing and the resolution of the position signal, so that the electrode 120 covered on the outer surface of the main body 110 may sense the approaching of the external conductor of the main body 110 in various directions, and distinguish the position of the conductor relative to housing 100.

As shown in FIG. 2, in this embodiment, at least two electrodes 120 are arranged on the housing 100 in an array.

In other embodiments, at least two electrodes 120 may also be distributed disorderly on the housing 100.

Figure 5:
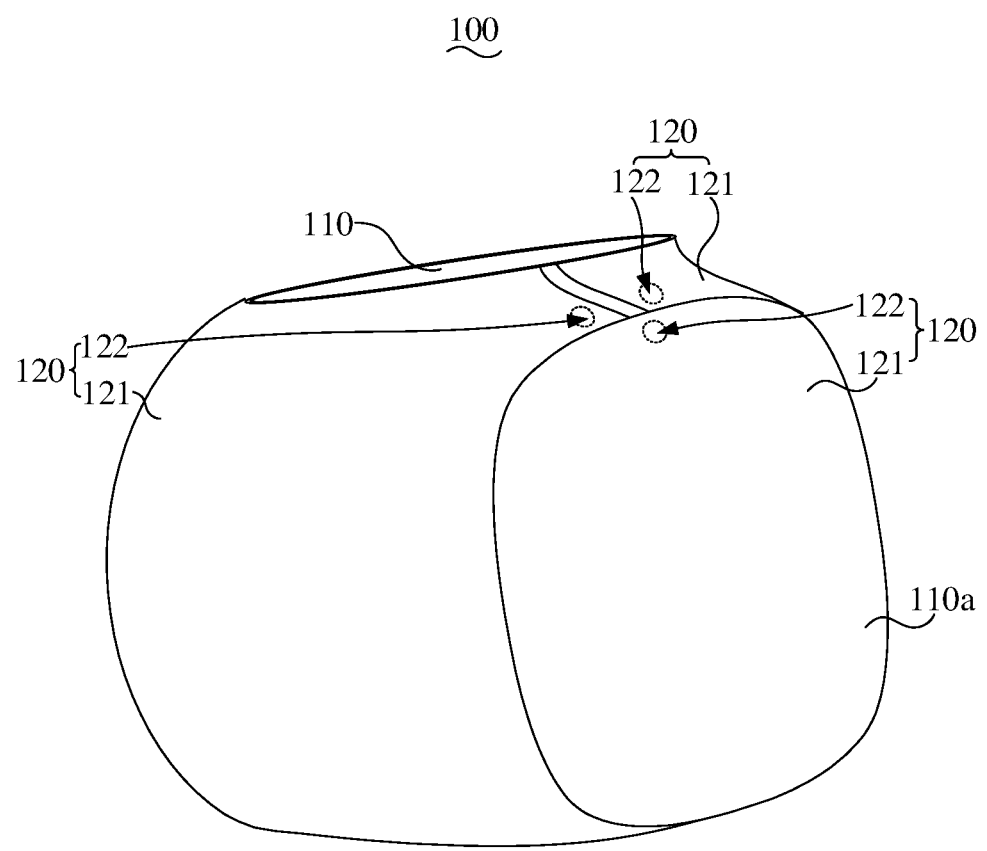
FIG. 5 is a third schematic diagram of an embodiment of a housing of mechanical equipment in the present disclosure.

Referring to FIG. 5, it is a third schematic diagram of an embodiment of a housing of mechanical equipment in the present disclosure.

Optionally, the main body 110 comprises an end portion 110a, and there are at least three electrodes 120, wherein at least two electrodes 120 are enclosed and distributed circumferentially around the main body 110 together, and at least one electrode 120 is distributed on the end side of the main body 110.

Specifically, the main body 110 may be a columnar structure with at least one end closed, for example, a hollow cylindrical structure comprising a bottom surface.

As shown in FIG. 5, the peripheral side of the main body 110 may be provided with through-holes to adapt to the structure of mechanical equipment and facilitate assembly.

"Enclosed" means surrounding, that is, at least two electrodes 120 are distributed around the main body 110. The expression "at least one other electrode 120 is distributed on the end side of the main body 110" means that at least one other electrode 120 is distributed on the outer surface of the end portion of the main body 110.

By making the number of electrodes 120 at least three, and at least two electrodes 120 are enclosed and distributed circumferentially around the main body 110, and at least another one electrode 120 is distributed on a side of end portion of the main body 110, the housing 100 is capable of forming a capacitance with an approaching conductor appearing on the peripheral side and end side of the main body 110 through the sensing area 121 of the electrode 120, to sense the approaching of the external conductor in various directions.

Figure 6:
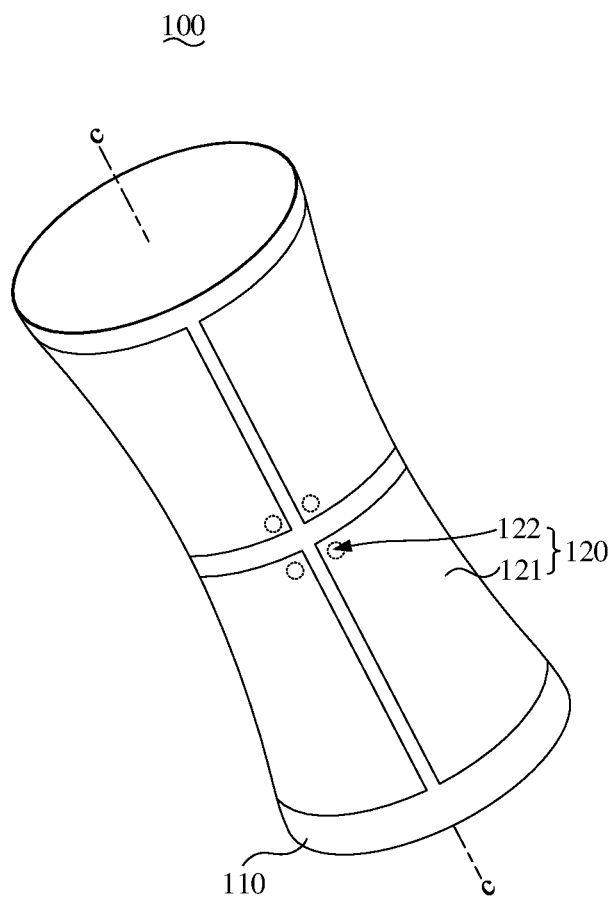
FIG. 6 is the fourth schematic diagram of an embodiment of a housing of mechanical equipment in the present disclosure.

Referring to FIG. 6, it is the fourth schematic diagram of an embodiment of a housing of mechanical equipment in the present disclosure.

In this embodiment, the main body 110 may be a hollow columnar structure, for example, the hollow cylinder shown in 6, and the axis of the main body 110 is shown as c-c.

Optionally, the extension direction of the spacing area of at least two electrodes 120 is parallel to or perpendicular to the axial direction of the main body 110.

The axial direction is the direction of the axis of the main body 110 as shown by c-c.

As shown in FIG. 6, the shape of the electrode 120 may be square, and the sides of the electrode 120 are parallel to or perpendicular with the axis of the main body 110. Accordingly, the extension direction of the spacing area of each two adjacent electrodes 120 is parallel to or perpendicular to the axial direction of the main body 110.

Since the extension direction of the spacing area of every two adjacent electrodes 120 is parallel to or perpendicular to the axial direction of the main body 110, the electrodes 120 distributed on the main body 110 may sense the approaching of the external conductors along the axial or circumferential direction of the main body 110 in different directions, to further improve the resolution of the housing 100 to the position information of the approaching conductor, so that the mechanical equipment make different response according to the position information of the approaching conductor.

In an application scenario, it is also possible to achieve virtual buttons by setting the arrangement of multiple electrodes 120 on the main body 110.

Optionally, referring to FIGS. 3 to 6, the respective connection areas 122 of adjacent electrodes 120 are arranged adjacent to each other.

By arranging the respective connection areas 122 of adjacent electrodes 120 adjacently to each other, the connection area 122 and the peripheral circuit may be conveniently connected. For example, the peripheral circuit may be arranged in the middle position of several adjacent electrodes 120, and the respective connection areas 122 of each electrode 120 are located adjacent to each other and close to the peripheral circuit, so that the connection path is shorter, which facilitates the connection between the connection area 122 and the peripheral circuit.

Optionally, the connection area 122 is a part of the sensing area 121 and is integrally formed with the sensing area 121.

It should be noted that, in the present disclosure, the connection area 122 and the sensing area 121 of the electrode 120 are only functionally divided. In the actual structure, the connection area 122 may be a part of the sensing area 121 and may be integrally formed with the sensing area 121. It may be a structure provided independent of the sensing area 121, and the connection area 122 is connected electrically with the sensing area 121.

In an embodiment, the connection area 122 and the sensing area 121 are integrally formed, for example, the electrode 120 is an integrally formed metal sheet, and the connection area 122 is an area where the metal sheet is connected to a peripheral circuit (e.g., welding).

By setting the connection area 122 as a part of the sensing area 121, and the connection area 122 and the sensing area 121 are integrally formed, the difficulty of processing and assembling may be reduced, the cost is reduced and the structural stability of the housing 100 is increased.

Figure 7:
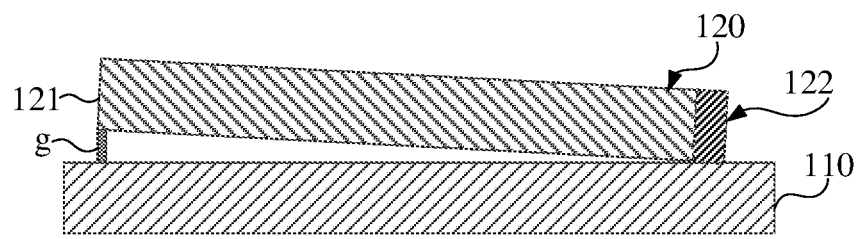
FIG. 7 is a sectional view of another embodiment of a housing of mechanical equipment in the present disclosure.

Referring to FIG. 7, it is a sectional view of another embodiment of a housing of mechanical equipment in the present disclosure.

In this embodiment, the other structures may be the same as the above embodiment, except that the sensing area 121 of the electrode 120 is arranged obliquely to the main body 110.

As shown in FIG. 7, the sensing area 121 of the electrode 120 is arranged obliquely to the main body 110, which may be connected and arranged to be fixed to the surface of the main body 110 by the support g.

In other embodiments, at least one surface of the main body 110 may be an inclined plane, so that the sensing area 121 of the electrode 120 is arranged relatively obliquely on the surface of the main body 110.

By disposing the sensing area 121 of the electrode 120 obliquely to the main body 110, i.e., the distance between the various parts of the sensing area 121 of the electrode 120 and the main body 110 is not exactly the same, the distance between each part on the sensing area 121 of the same electrode 120 and the main body 110 is not quite the same when the mechanical equipment moves, so that the sensing intensity of each part on the sensing area 121 of the electrode 120 may be adjusted.

Optionally, electrode 120 has a compact integrated structure or hollow structure.

The electrode 120 has a compact integrated structure, for example, a metal film or sheet (such as copper foil), by making the electrode 120 a compact integrated structure, it may be easily attached to the outer surface of the main body 110, which is not easily damaged and has durability. The electrode 120 is a hollow structure, which specifically may be a mesh structure, or a structure having multiple wires arranged at intervals. By making the electrode 120 a hollow structure, the materials for manufacturing the electrode 120 may be reduced, thereby reducing the manufacturing cost.

In another aspect, when the thickness of the electrode 120 is constant, by making the electrode 120 a hollow structure, the capacitance of the electrode 120 may be reduced, so that a close detection of the approaching conductor may be realized while reducing the manufacturing cost.

Figure 8:
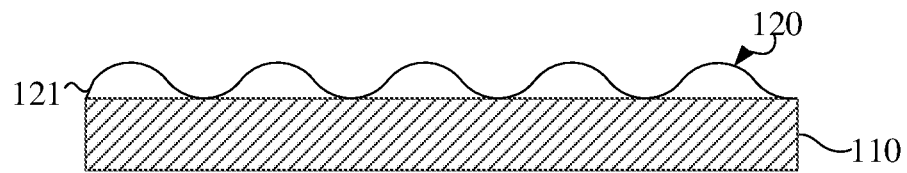
FIG. 8 is a fifth sectional view of an embodiment of a housing of mechanical equipment in the present disclosure.

Referring to FIG. 8, which is a fifth sectional view of an embodiment of a housing of mechanical equipment in the present disclosure.

Optionally, the electrode 120 is arranged to be wave-shaped on a surface of main body 110.

The electrode 120 is arranged on the surface of the main body 110 in a wave form, i.e., the cross section of the electrode 120 perpendicular to the surface of the main body 110 is in a wave form, which may increase the surface area of the electrode 120, thereby increasing the surface area of the sensing area 121 of the electrode 120, enhancing the sensing effect of the electrode 120 and improving the sensing sensitivity of the electrode 110 to the approaching conductor.

The surface of the main body 110 shown in FIG. 8 is planar. It may be understood that the surface of the main body 110 may also be wavy to adapt to the shape of the electrode 120. When the sensing area 121 of the electrode 120 is directly coated with the surface of the main body 110, the surface of the main body 110 is in a wave shape, and the sensing area 121 of the coated electrode 120 is also in a wave shape.

Optionally, the material of electrode 120 comprises copper, silver, aluminum or ITO.

ITO is an N-type oxide semiconductor-indium tin oxide. ITO may be made into an ITO thin film, that is, an indium tin oxide semi-conductor transparent conductive film, as the electrode 120.

The material of electrode 120 may be one or more of copper, silver, aluminum or ITO, namely, when there are two or more electrodes 120, different electrodes 120 may be made of the same material, or made of different materials.

Optionally, the main body 110 is an insulator, and the electrode 120 is coated on the main body 110 or embedded in the main body 110.

The main body 110 is an insulator, such as rubber, plastic, glass, ceramic, etc.

The outer surface of the main body 110 may have a compact integrated structure or the main body 110 may be a hollow structure.

The electrode 120 is coated on the main body 110, that is, the outer surface of the main body 110 is covered with a layer of the material of electrode 120. For example, the outer surface of the main body 110 is covered with the material of electrode 120 by dipping, spraying or spin coating.

The electrode 120 may be embedded in the main body 110, for example, the main body 110 is a hollow structure, specifically a mesh structure, and the electrode 120 may be embedded in the mesh of the main body 110. It is also possible that the outer surface of the main body 110 is provided with a groove adapted to the electrode 120, and the electrode 120 may be embedded in the groove.

The main body 110 is an insulator, so the electrodes 120 that are not in contact with each other are insulated from each other.

Optionally, a protective layer (not shown in the figure) may be arranged on the side surface of the housing 100 where the electrode 120 is arranged. Specifically, a layer of inert polymer material may be coated on the surface of electrode 120, and the inert polymer material may be PVA (polyvinyl alcohol), PET (polyester), PI (polyamide), etc. With a protective layer, the electrode 120 is protected from abrasion, and the electrode 120 is prevented from deforming: in addition, the electrode 120 may be fixed twice, thereby making the structure of the housing 100 more stable.

Figure 9:
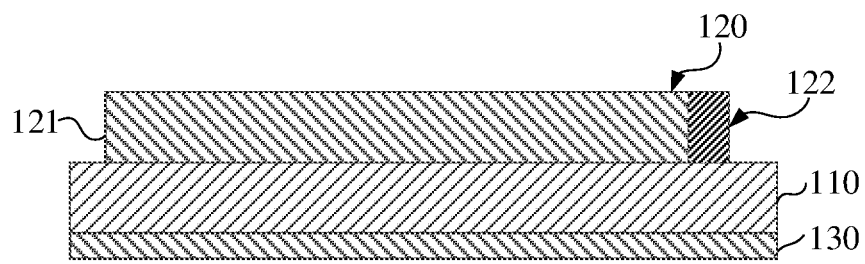
FIG. 9 is a sixth sectional view of an embodiment of a housing of mechanical equipment in the present disclosure.

Referring to FIG. 9, it is a sixth sectional view of an embodiment of a housing of mechanical equipment in the present disclosure.

Optionally, the housing 100 further comprises a shielding layer 130, wherein the shielding layer 130 is located inside the housing 100, and is arranged to be opposite to the electrode 120, and has an area that is no less than an area of the corresponding electrode 120.

The material of the insulating layer 140 may be, for example, rubber, plastic, glass, ceramic, etc.

The shielding layer 130 may have the function of anti-interference. When the housing 100 is assembled on the mechanical equipment, the shielding layer 130 may be grounded, and the shielding layer 130 may conduct the interference signal inside the mechanical equipment to the ground, thereby reducing the interference to the electrode 120 from the interference signal, and improving the sensing accuracy of housing 100 to the approaching conductor.

In other embodiments, the shielding layer 130 may also be electrically floated or may be configured to connect to the detection circuit 210 to receive a preset voltage, to realize active shielding.

"The inside of the housing 100" means that, when the housing 100 is assembled on the mechanical equipment, the housing 100 is in the side close to the mechanical equipment. The shielding layer 130 is located inside the housing 100, and the shielding layer 130 is arranged to be opposite to the electrode 120, that is, the shielding layer 130 and the corresponding electrode 120 are arranged on both sides of the housing 100, respectively.

The shielding layer 130 may be arranged to be opposite to the electrode 120, and has an area that is no less than an area of the corresponding electrode 120. The shielding layer 130 may completely cover the inner surface of the housing 100, so as to enhance the shielding effect.

Figure 10:
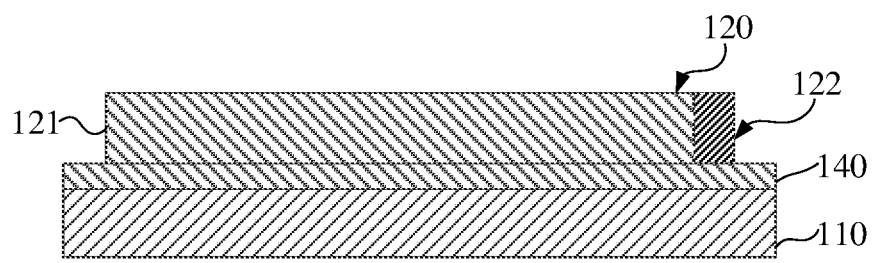
FIG. 10 is a sectional view of another embodiment of a hosing of mechanical equipment housing in the present disclosure.

Referring to FIG. 10, it is a sectional view of another embodiment of a hosing of mechanical equipment housing in the present disclosure.

Optionally, the main body 110 is a conductor, the electrode 120 is located at the outer surface of the main body 110, and an insulating layer 140 is arranged between them.

The material of the insulating layer 140 may be, for example, rubber, plastic, glass, ceramic, etc. The main body 110 is a conductor, which has the functions of a shielding layer.

Optionally, the shape of housing 100 matches with the shape of the outer surface of mechanical equipment.

The shape of the housing 100 matches with the shape of the outer surface of the mechanical equipment, that is, the shape of the side of the housing 100 attached to the main body 110 is the same or substantially the same as the shape of the outer surface of the mechanical equipment.

The shape of housing 100 matches with the shape of the outer surface of the mechanical equipment, so that the entire housing 100 may adhere to the outer surface of the mechanical equipment like human skin that attaches to human torso, thereby reducing the impact of the housing 100 on the movement of mechanical equipment and improving the performance, and further making the mechanical equipment more beautiful.

Optionally, the housing 100 partially encloses the mechanical equipment, and is used in combination with at least another housing 100 to enclose the mechanical equipment as a whole.

Referring to FIG. 1, there may be multiple housings 100, and the multiple square housings 100 may be combined with each other to enclose the mechanical equipment as a whole.

Referring to FIG. 5, the housing 100 shown in FIG. 5 may also be composed of a housing 100 of a hollow cylindrical structure in combination with a housing 100 that may be used as a housing 100 end portion of the hollow cylindrical structure to enclose the mechanical equipment as a whole.

Figure 11:
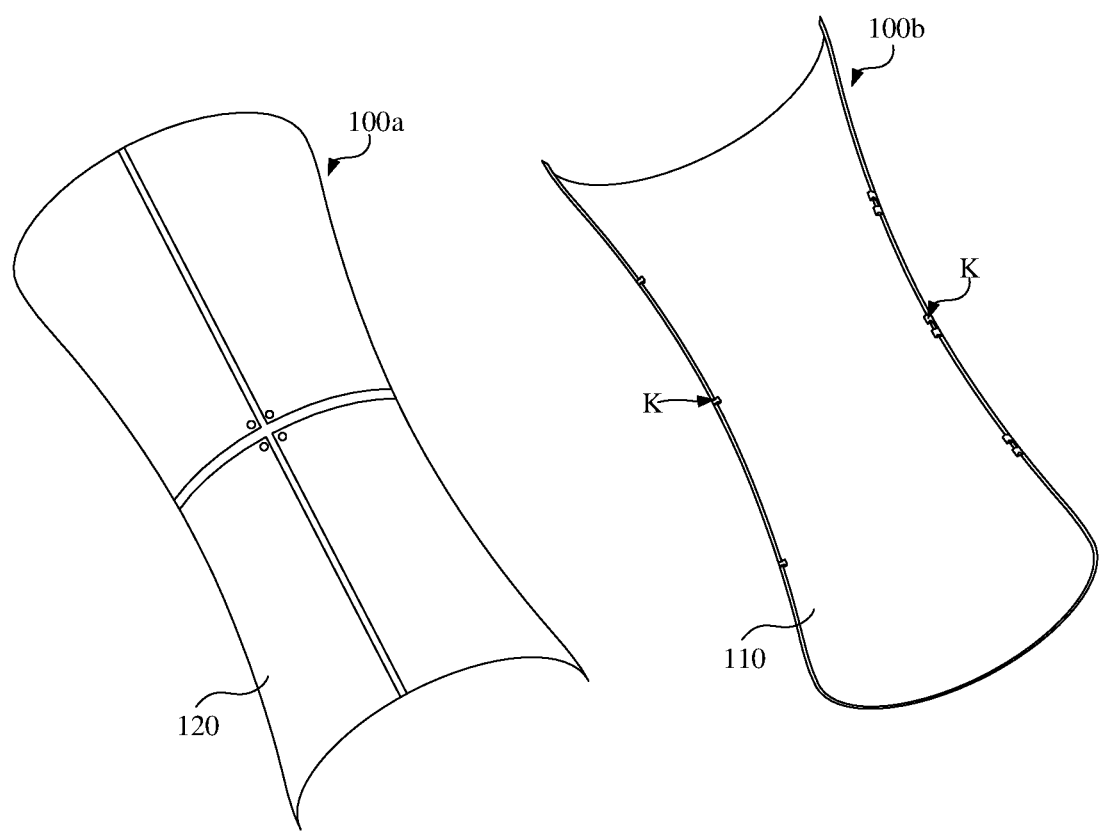
FIG. 11 is an exploded view of a housing shown in FIG. 6.

Referring to FIG. 6 and FIG. 11, FIG. 11 is a disassembled view of the housing 100 shown in FIG. 6:

The housing 100 shown in FIG. 6 may also be composed of two independent housings 100a and 100b. The two housings 100a and 100b are combined to enclose the mechanical equipment as a whole, so that the mechanical equipment may sense the approaching conductor in all directions.

Optionally, there may be at least two housings 100. Since the a side of housing 100 adjacent to another housing 100 is provided with a buckle structure k, two housings 100 may be connected by the buckle structure k, which is convenient for assembly and disassembly.

Referring to FIG. 11, the approaching side of housing 100a and another housing 100b has a buckle structure k. In FIG. 11, the buckle structure k is schematically shown on the side of the housing 100b. It should be understood that, a corresponding buckle structure k is also arranged on the side of the housing 100a.

Further, referring to FIG. 6 and FIG. 11, the diameter of the middle portion of the housing 100 enclosing the mechanical equipment is smaller than the diameter of the end portion so that the housing is configured to fit the shape of the mechanical equipment.

When at least two housings 100a and 100b are combined to enclose the mechanical equipment as a whole, the diameter of the middle part of the housings 100a and 100b enclosing the mechanical equipment is smaller than the diameter of the end part, so that the fixing structure will not be loosened after the housings 100a and 100b are fixed to each other, thereby tightly wrapping the outer surface of the mechanical equipment.

Figure 12:
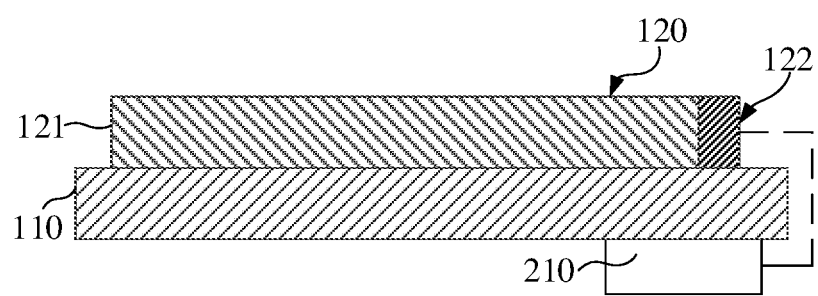
FIG. 12 is a first sectional view of an embodiment of a housing assembly of mechanical equipment in the present disclosure.

Based on this, the present disclosure further provides a housing assembly 200 of mechanical equipment. Referring to FIG. 12, it is a first sectional view of an embodiment of a housing assembly of mechanical equipment in the present disclosure.

In this embodiment, the housing assembly 200 of mechanical equipment comprises a detection circuit 210 and a housing 100 in any of the above embodiments.

The detection circuit 210 is arranged on the housing 100, and the detection circuit 210 is connected to the connection area 122 of the electrode 120. The detection circuit 210 is configured to transmit electrical signals representing the capacitance or a change in the capacitance to a peripheral circuit.

Specifically, referring to FIG. 12, the housing 100 comprises a main body 110 and an electrode 120, the electrode 120 is arranged on main body 110 and is composed of a sensing area 121 and connection area 122 that are connected to each other. The detection circuit 210 is arranged on the main body 110, and the detection circuit 210 is connected to the connection area 122 of the electrode 120. The connection area 122 of the electrode 120 is configured to transmit electrical signals representing the capacitance or a change in the capacitance to the peripheral circuit through the detection circuit 210 connected to the connection area 122.

Figure 13:
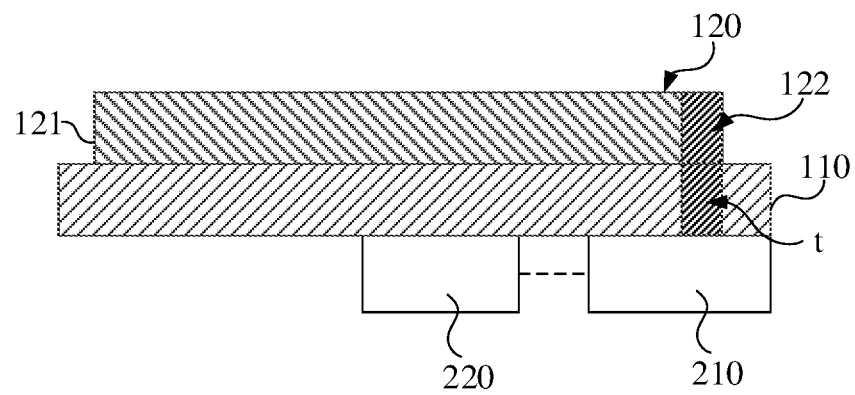
FIG. 13 is a second sectional view of an embodiment of a housing assembly of mechanical equipment in the present disclosure.

Please refer to FIG. 13, which is a second sectional view of an embodiment of a housing assembly of mechanical equipment in the present disclosure.

Optionally, the detection circuit 210 comprises a detection circuit board 210 that is arranged to be fixed inside the housing 100 or embedded in the housing 100. A part of the main body 110 between the electrode 120 and the detection circuit board 210 is provided with a via hole t, and the detection circuit board 210 is connected with the electrode 120 through the via hole t.

As shown in FIG. 12 and FIG. 13, the detection circuit board 210 may be arranged to be fixed inside the main body 110. In other embodiments, the detection circuit board 210 may also be embedded in the main body 110.

A part of the main body 110 between the electrode 120 and the detection circuit board 210 is provided with a via hole t. The via hole t may allow conductors such as wires, leads or pins to pass through to conduct the detection circuit board 210 and the connection area 122 of the electrode 120, so that the detection circuit board 210 may be connected with the electrode 120 through the via hole.

Optionally, the detection circuit board 210 is arranged to be fixed inside the housing 100 through glue, screw connection or welding.

Specifically, the detection circuit board 210 is provided with a bonding pad at a position corresponding to the through-hole k, and the detection circuit board 210 is fixed to the conductive portion through the bonding pad.

Figure 14:
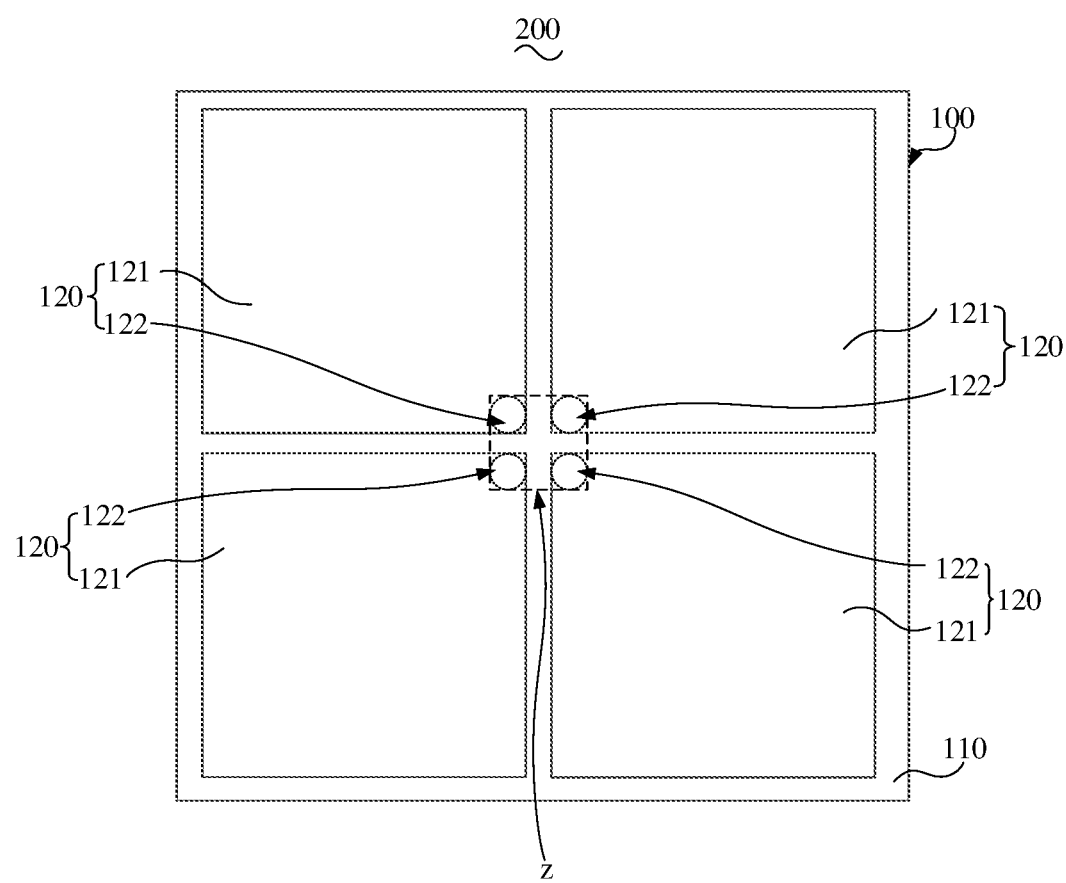
FIG. 14 is a schematic diagram of the outer structure of an embodiment of a housing assembly of mechanical equipment in the present disclosure.
Figure 15:
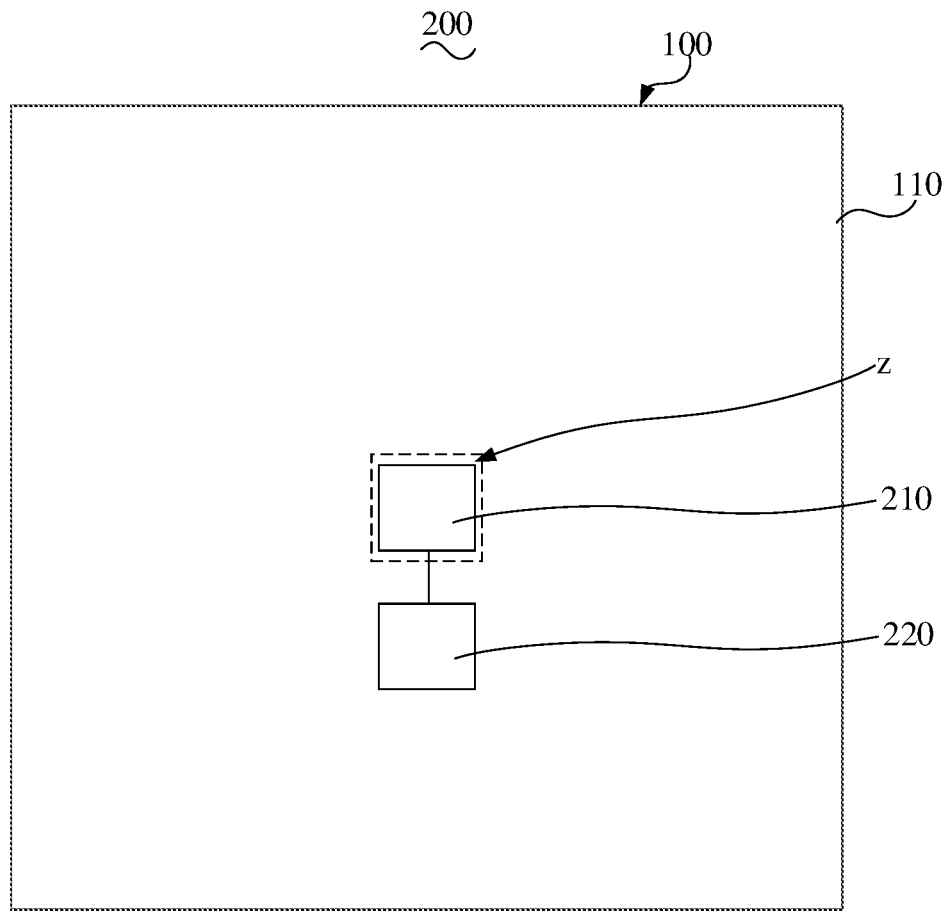
FIG. 15 is a schematic diagram of the internal structure of an embodiment of a housing assembly of mechanical equipment in the present disclosure.

Referring to both FIG. 14 and FIG. 15, FIG. 14 a schematic diagram of the outer structure of an embodiment of a housing assembly of mechanical equipment in the present disclosure, and FIG. 15 is a schematic diagram of the internal structure of an embodiment of a housing assembly of mechanical equipment in the present disclosure.

Optionally, the detection circuit board 210 is a multi-channel circuit board, with multiple detection input terminals, there are multiple electrodes 120, and each detection input terminal is correspondingly connected to one electrode 120.

As shown in FIG. 14, taking the detection circuit board 210 as a four-channel circuit board as an example, the detection circuit board 210 has four detection input terminals. Correspondingly, the number of electrodes 120 is four, and each detection input terminal is correspondingly connected to one electrode 120.

As shown in FIG. 15, further, the respective connection areas 122 of the adjacent electrodes 120 are provided adjacent to each other, and the detection circuit board 210 is located in the area z where each connection area 122 is located.

Wherein the area z where each connection area 122 is located refers to the smallest area that comprises each connection area 122. As shown in FIG. 12, when the cross section of each connection area 122 is circular and the electrodes 120 are arranged in a matrix, the area z where each connection area 122 is located is square, and each side of the square is tangent to each connection area 122.

The detection circuit board 210 is located in the area z where each connection area 122 is located, which means that the projection of the detection circuit board 210 perpendicular to the housing 100 is located in the area z.

Further, the detection circuit board 210 may be arranged to be fixed inside the main body 110, and a part of the main body 110 between the electrode 120 and the detection circuit board 210 is provided with a via hole t, which may allow conductors such as wires, leads, or pins to pass through to conduct the detection circuit board 210 and the connection area 122 of the electrode 120, such that the four detection input terminals of the detection circuit board 210 may be respectively connected with the connection area 122 of the four electrodes 120 through the via hole t.

By arranging the respective connection areas 122 of adjacent electrodes 120 adjacent to each other, it is convenient to connect the connection area 122 and the detection circuit board 210. The detection circuit board 210 is located in the area where each connection area 122 is located, thereby making the connection path shorter and facilitating the connection between the connection area 122 and detection circuit board 210.

Optionally, please continue to refer to FIG. 15, the peripheral circuit is a processor 220 located on housing 100 that is configured to process electrical signals to obtain the distance between the electrode 120 and the conductor or a change of the distance between the electrode 120 and the conductor.

Specifically, the peripheral circuit may be arranged inside the main body 110, and the peripheral circuit is configured to receive electrical signals representing the capacitance or a change in the capacitance sent by the detection circuit 210 to obtain data that reflect the distance between the electrode 120 and the conductor or a change of the distance between the electrode 120 and the conductor.

The housing assembly 200 provided in this embodiment comprises the detection circuit 210 of the housing 100 of any of the above embodiments, and the detection circuit 210 is arranged on the housing 100 and connected to the connection area 122 of the electrode 120. The electrical signals representing the capacitance or a change in the capacitance are transmitted to a peripheral circuit by the detection circuit 210, so that the peripheral circuit may process the electrical signals to obtain data reflecting the distance between the electrode 120 and the conductor or a change of the distance between the electrode 120 and the conductor, and the housing 100 of mechanical equipment may sense the approaching of the external conductor, to achieve non-contact distance sensing.

Based on this, the present disclosure further provides a mechanical arm 300. Please refer to FIG. 16, it is a schematic diagram of an embodiment of a mechanical arm in the present disclosure.

In this embodiment, the mechanical arm 300 has a main part 310, at least one joint module 320 connected to the main part 310, and a detection circuit 210; the main part 310 and/or the joint module 320 comprise the housing 100 in any of the above embodiments, and the detection circuit 210 is connected with the electrode 120.

Wherein at least one end portion of the main part 310 is connected to the joint module 320, and the joint module 320 may drive the main part 310 to swing.

Figure 16:
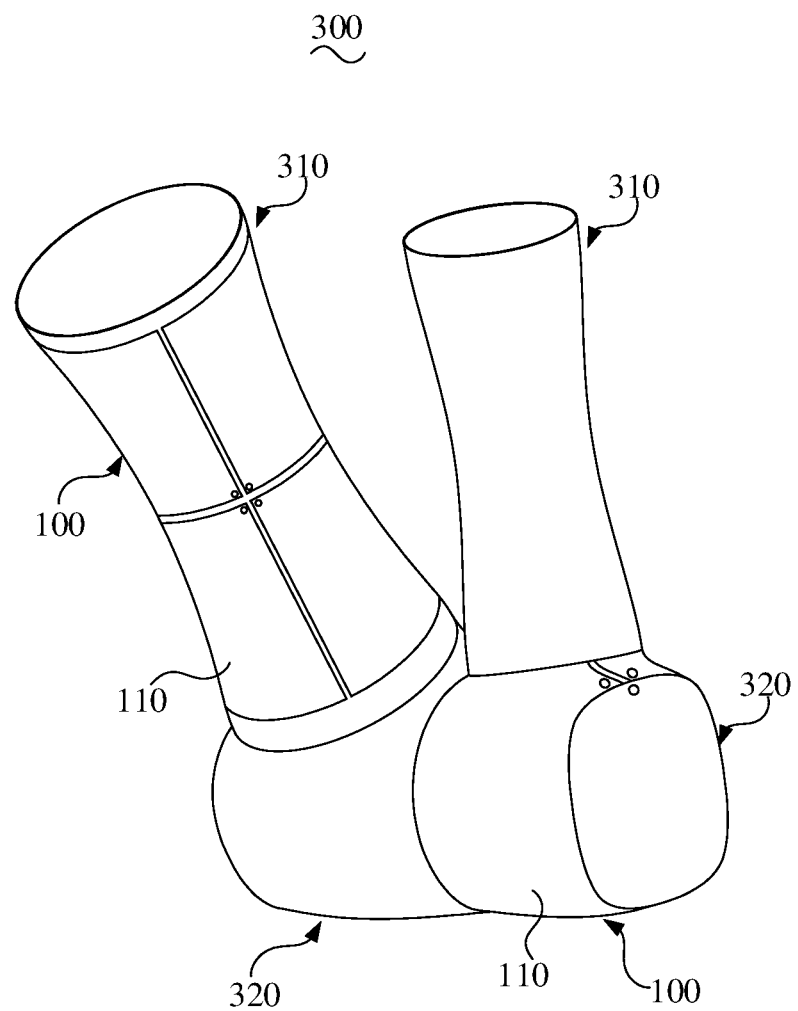
FIG. 16 is a schematic diagram of an embodiment of a mechanical arm in the present disclosure.

As shown in FIG. 16, the mechanical arm 300 has two main parts 310 and two joint modules 320. In other embodiments, the mechanical arm 300 may also have only one main part 310 and one joint module 320, or have more than two main parts 310 and more than two joint modules 320.

Wherein at least one main part 310 and at least one joint module 320 of the mechanical arm 300 are mounted with the housing 100.

Optionally, the main part 310 and the joint module 320 comprise a hollow frame, and the housing 100 is sleeved on the outer surface of the hollow frame.

Optionally, the detection circuit 210 comprise a detection circuit board (not shown in FIG. 16). The detection circuit board may be arranged to be fixed inside the housing 100, embedded in the housing 100, fixed at the outer surface of the hollow frame, or located in the hollow frame, and the detection circuit board is connected with the electrode 120.

Optionally, the electrode 120, the main body 110 and the hollow frame are matched in shape.

That the electrode 120, the main body 110 and the hollow frame are matched in shape comprises: the shape of the electrode 120 matches with the shape of the outer surface of the main body 110, and the shape of the housing 100 matches with the shape of the hollow frame. That is, the shape of the electrode 120 on the side attached to the main body 110 is consistent or substantially consistent with the shape of the outer surface of the main body 110, and the shape of the housing 100 on the side attached to the hollow frame is consistent or substantially consistent with the shape of the outer surface of the hollow frame.

The electrode 120 is attached to the outer surface of main body 110, and the main body 110 is attached to the outer surface of the mechanical equipment.

The electrode 120, the main body 110 and the hollow frame are matched in shape, so that the housing 100 as a whole may be adhered to the outer surface of the mechanical equipment like human skin attached to the torso, thereby reducing the impact of the housing 100 on the movement of the mechanical equipment, improving the performance, and making more beautiful.

Optionally, there is a space between the housing 100 and the hollow frame, the leading-out terminal of the detection circuit board is configured to be connected with the control circuit of the mechanical arm 300 through a data cable, and the space between housing 100 and the hollow frame is configured to receive the data cable.

The space between the housing 100 and the hollow frame may be 1 to 3 mm, for example, 1 mm, 2 mm or 3 mm.

Based on this, the present disclosure further provides a robot 400. Referring to both FIG. 16 and FIG. 17, FIG. 17 is a schematic diagram of an embodiment of a robot in the present disclosure.

This embodiment provides a robot 400. The robot 400 comprises a base 410 and at least one mechanical arm 300.

The mechanical arm 300 is connected to the base 410, and has a main part 310, at least one joint module 320 connected to the main part 310, and a detection circuit 210; the main part 310 and/or the joint module 320 comprise the housing 100 (not shown in FIG. 14) of any of the above embodiments, and the detection circuit 210 (not shown in FIG. 14) is connected to the electrode 120.

Figure 17:
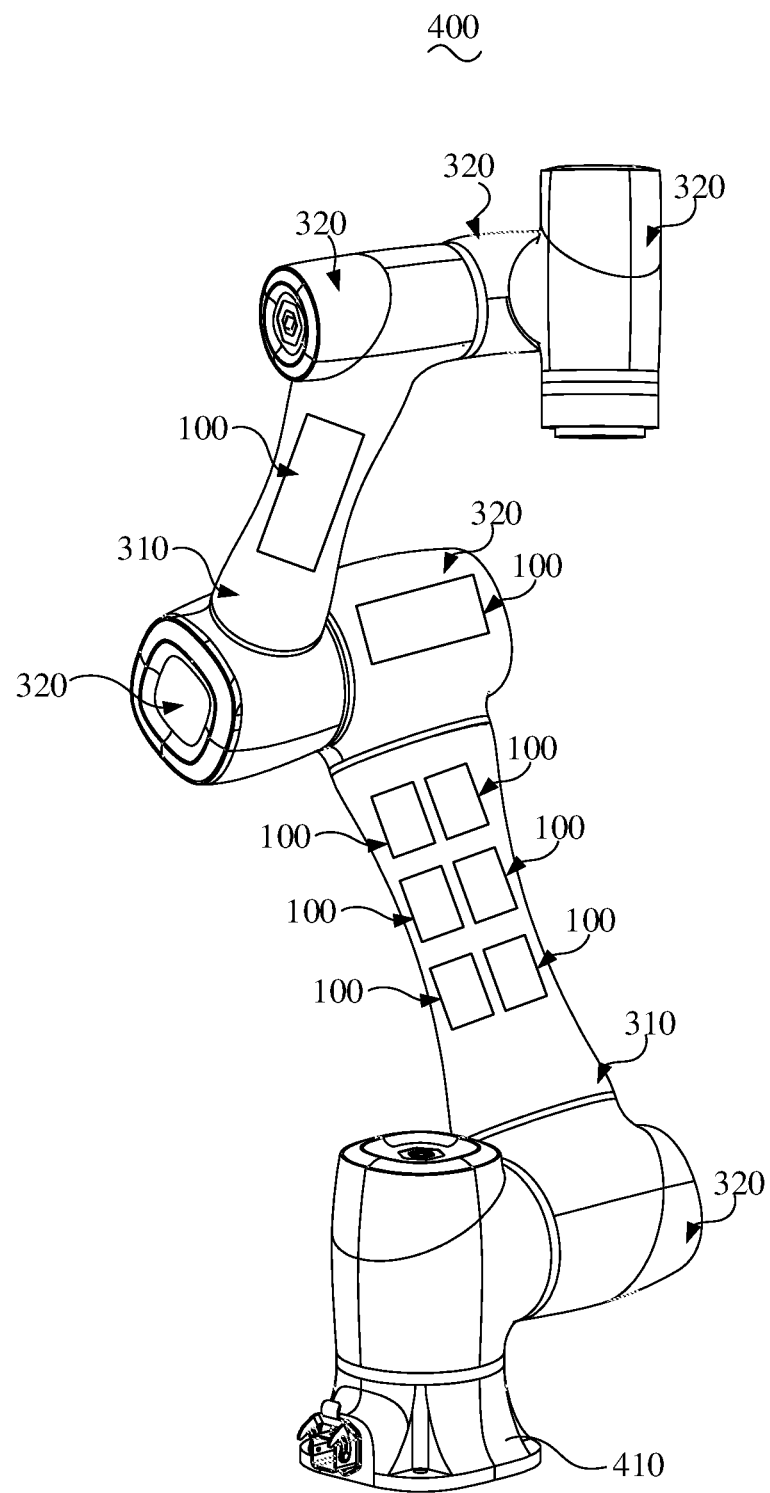
FIG. 17 is a schematic diagram of an embodiment of a robot in the present disclosure.

It should be noted that FIG. 17 only exemplarily shows part of the surface of the robot covered by the housing 100. It should be understood that, the housing 100 may also cover the entire surface of the robot.

Optionally, the robot 400 further comprises a control circuit (not shown in the figure), which is connected to the detection circuit 210 and makes response when the distance between the electrode 120 and the conductor or a change of the distance between the electrode 120 and the conductor meets the preset conditions.

The control circuit is connected to the detection circuit 210 and obtains electrical signals representing the capacitance or a change in the capacitance. After processing, the distance between the electrode 120 and the conductor or a change of the distance between the electrode 120 and the conductor is obtained, and the control circuit makes response when the distance between the electrode 120 and the conductor or a change of the distance between the electrode 120 and the conductor meets the preset conditions.

As shown in FIG. 17, in this embodiment, the robot 400 is a robot 400 having multiple joints, and the multi-joint robot 400 having multiple joints comprises two mechanical arms 300 and six joint modules 320.

In other embodiments, the robot 400 having multiple joints may also comprise more than two mechanical arms 300, and the number of joint modules 320 may be, for example, three, four, or five or more.

It may be understood that, the mounting position of the housing 100 on the robot 400 may be adjusted according to the type of the robot 400. For example, when the robot 400 is an accompanying robot 400, the housing 100 is generally mounted in front of the main body 110 of the robot 400 to facilitate users to operate. When the robot 400 is an industrial robot 400 or a cooperative robot 400, the housing 100 is generally mounted at the end of the robotic arm of the robot 400, so that the robotic arm may sense external objects, and then grab the objects or avoid collisions, etc.

For example, the control circuit may be configured to control the robot 400 to perform collision protection operations according to the distance between the conductor and the electrode 120 or a change of the distance between the conductor and the electrode 120. Alternatively, the control circuit is also configured to control the robot 400 to implement the drag teaching operation according to the distance between the conductor and the electrode 120 or a change of the distance between the conductor and the electrode 120.

It may be understood that, the combination of the distance detection technology of the robot 400 with the collision protection technology may reduce the use of infrared sensors, thereby reducing the cost. In addition, when the robot 400 independently performing task, it may effectively avoid the collision of obstacles and improve the safety of the robot 400.

The robot 400 dragging teaching is performed by "informing" the robot 400 in advance about the action information and the task information to be performed, etc. The information may be roughly divided into three categories: position and posture information, trajectory and waypoint information of the robot 400; task action sequence of the robot 400, etc.: additional conditions of the robot 400 during action and operation, etc., the action speed and acceleration, and task content of the robot 400, etc. In the process of dragging teaching of the robot 400, the action information and task information to be performed by the robot 400 may be affected by such factors as process, site, etc. In order to reduce such influence and improve the effect of dragging teaching, a solution is provided to combine the distance detection technology of the robot 400 with the robot 400 dragging teaching. According to the distance between the conductor and the electrode 120 or a change of the distance between the conductor and the electrode 120 during the robot 400 dragging teaching, the teaching may be better carried out.

In summary, based on the real-time detection of the distance between the conductor and the electrode 120 or a change of the distance between the conductor and the electrode 120 by the robot 400, it may be applied to other technologies of the robot 400, to achieve the expected effect, such as collision protection, dragging teaching, etc.

In some embodiments, the control circuit is also configured to prompt users according to the distance between the conductor and the electrode 120 or a change of the distance between the conductor and the electrode 120.

Specifically, 3D simulation software is configured to simulate the hardware environment and software environment of the robot 400. The display interface of the 3D simulation software comprises a plurality of small boxes corresponding to the electrode 120 and an alarm. If the conductor is not detected, the small boxes corresponding to the conductor are displayed in green: if the conductor is detected, the small boxes corresponding to the conductor are displayed in red. As the conductor approaches gradually, the red-green gradient indicates the distance of the conductor, and the frequency of the alarm sound indicates the change in the distance from the electrode 120. For example, when the conductor moves to the electrode 120 faster, the sound of the alarm becomes sharper.

In some embodiments, the control circuit 30 is also configured to implement virtual buttons according to the distance between the conductor and the electrode 120.

Specifically, when the distance between the conductor and the electrode 120 is less than or equal to the preset threshold value, it is determined that the user is performing a virtual button operation; and the coordinate position corresponding to the virtual button operation is determined according to the electrode 120 that sends electrical signals; and the virtual button operation subprogram is implemented according to the coordinate position.

Figure 18:
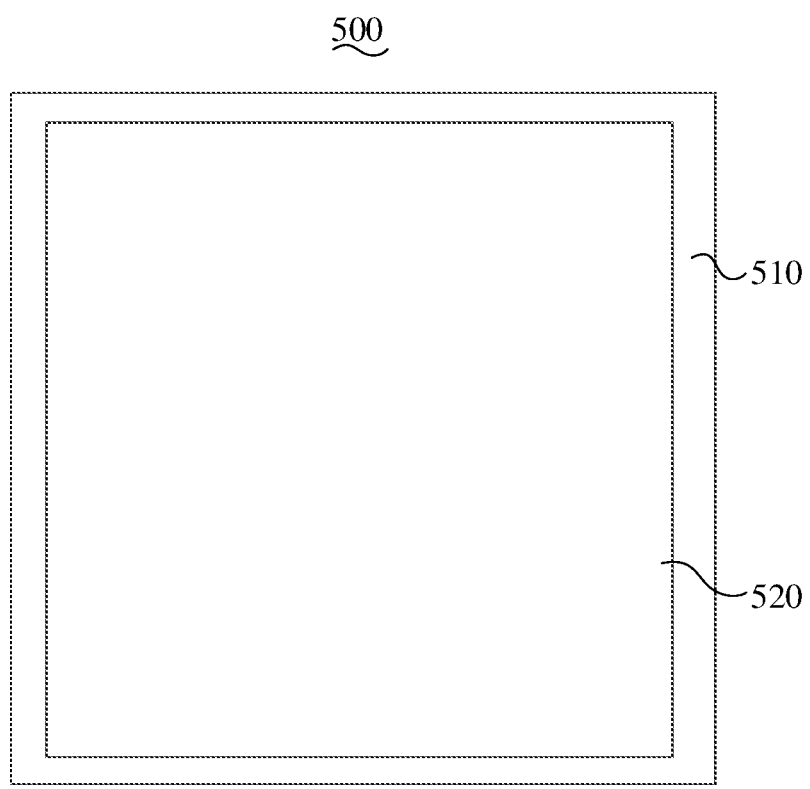
FIG. 18 is a schematic diagram of another embodiment of a housing of mechanical equipment in the present disclosure.

Please refer to FIG. 18, which is a schematic diagram of another embodiment of a housing of mechanical equipment in the present disclosure.

This embodiment provides a housing 500 of mechanical equipment. The housing 500 of mechanical equipment comprises a main body 510 and an electrode 520.

The electrode 520 is arranged on the main body 510, and the electrode 520 and a conductor that approaches the electrode generate a capacitance, and the electrode 520 is configured to be connected with a capacitance detection circuit or a charge detection circuit.

Regarding the specific structure of the electrode 520 and the main body 510, and the mutual connection and matching relationship between the electrode 520 and the main body 510, please refer to the description of the housing 100 in any of the above embodiments.

Figure 19:
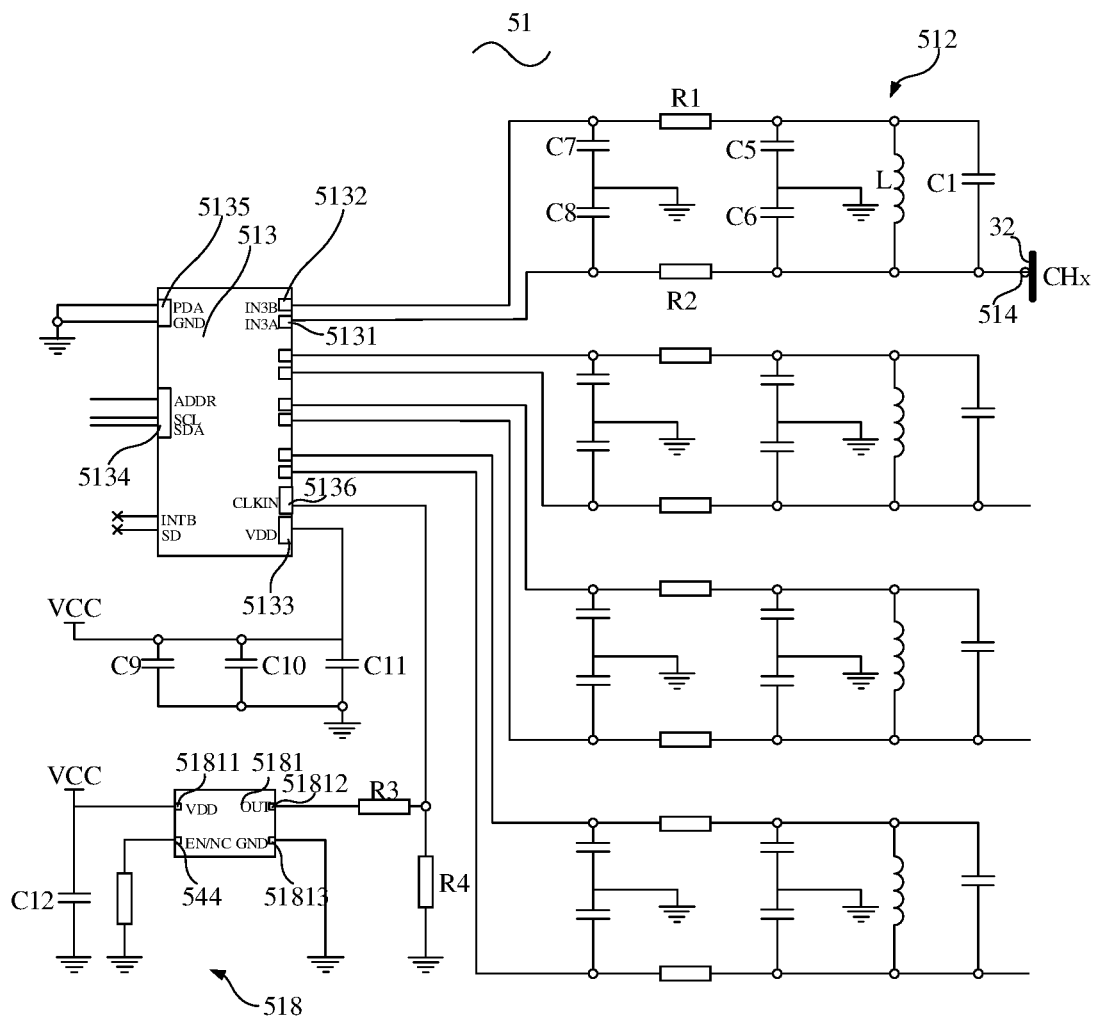
FIG. 19 is a schematic diagram of a circuit structure of a sensing circuit provided by an embodiment of the present disclosure.
Figure 20:
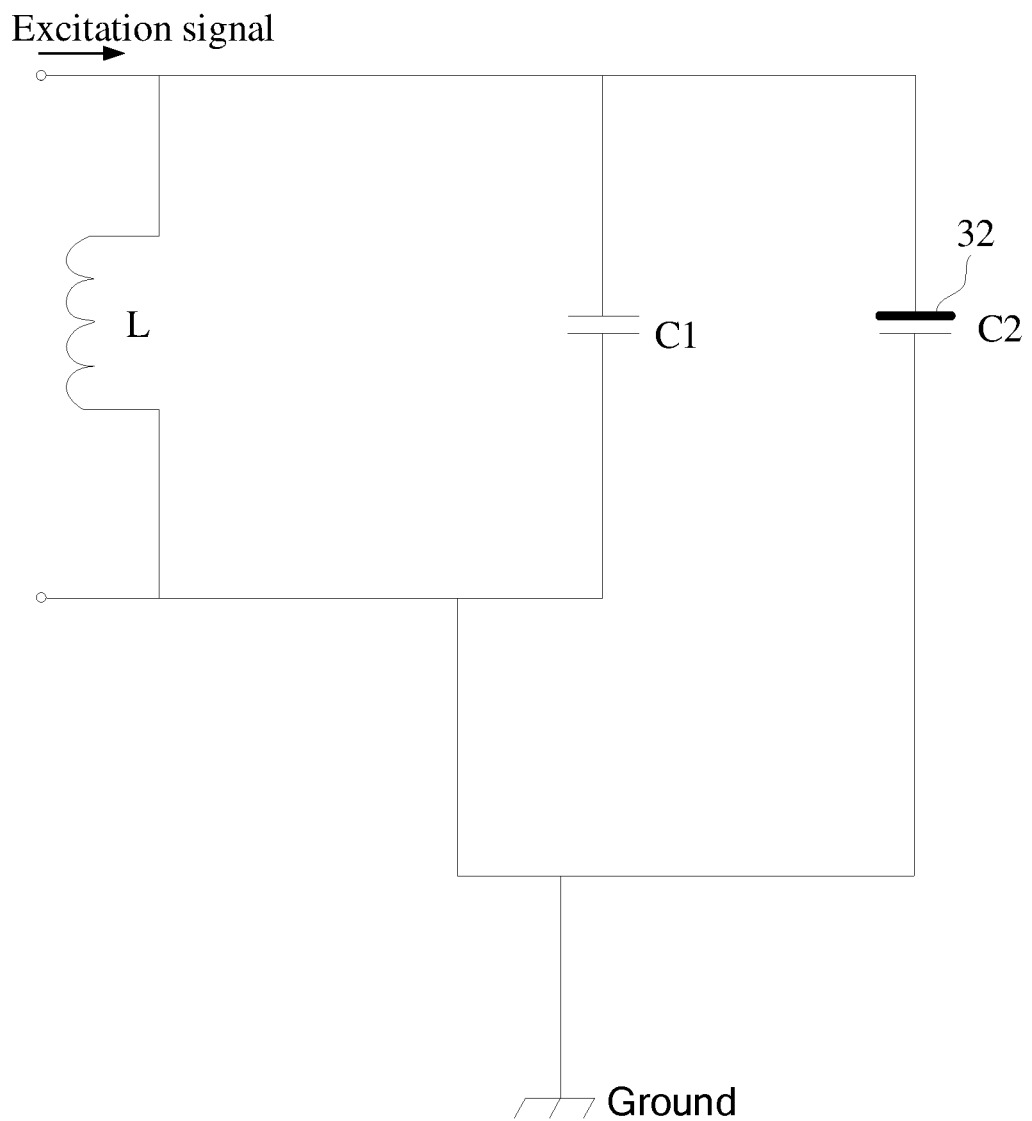
FIG. 20 is a schematic diagram of an equivalent circuit of an oscillatory circuit under a single oscillation mode provided by an embodiment of the present disclosure.
Figure 21:
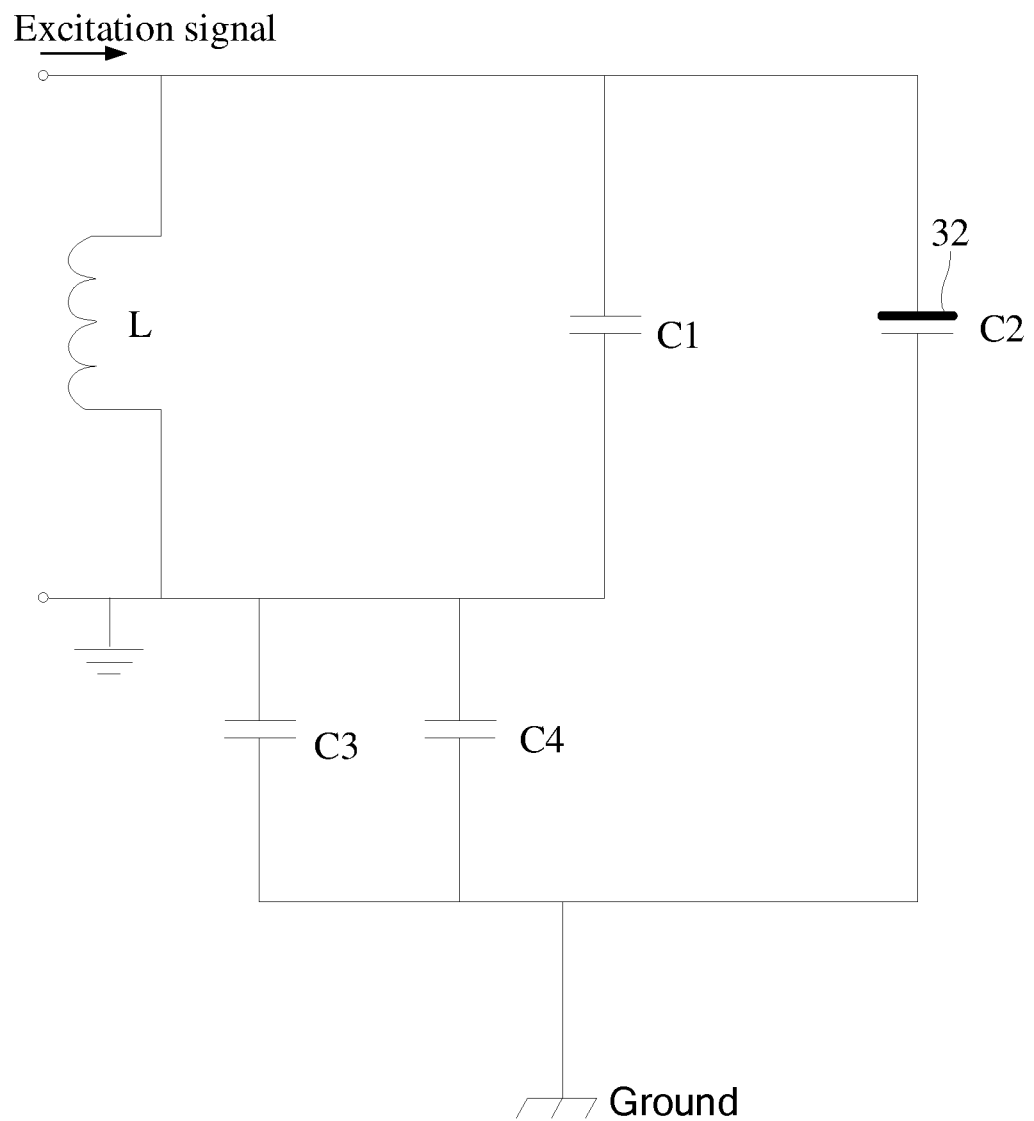
FIG. 21 is a schematic diagram of another equivalent circuit of an oscillatory circuit under a single oscillation mode provided by an embodiment of the present disclosure.
Figure 22:
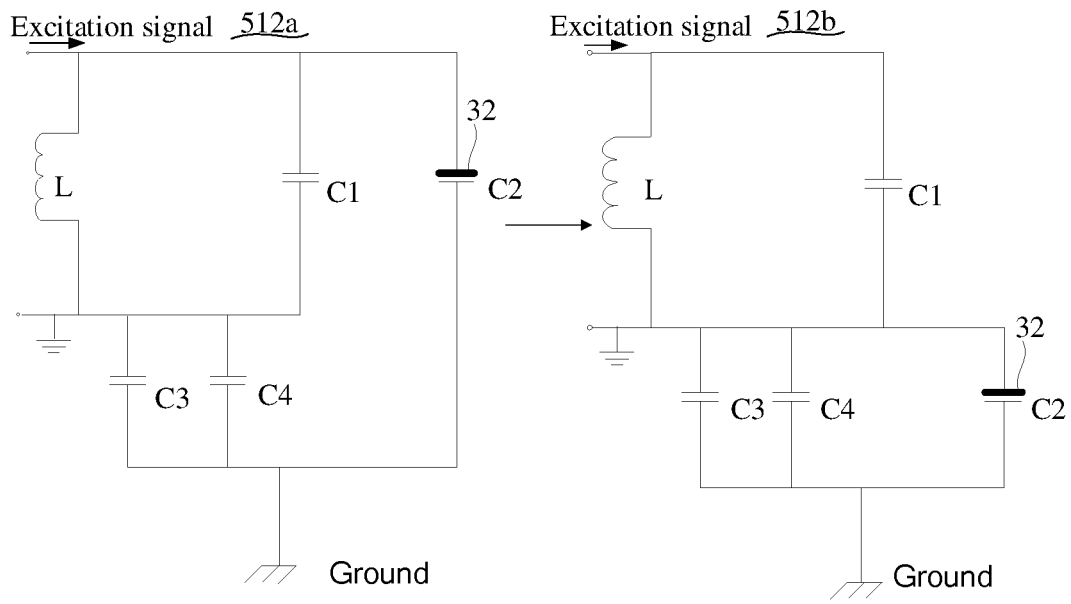
FIG. 22 is a schematic diagram of an equivalent circuit of a first oscillatory circuit and a second oscillatory circuit under a double oscillation mode provided by an embodiment of the present disclosure.
Figure 23:
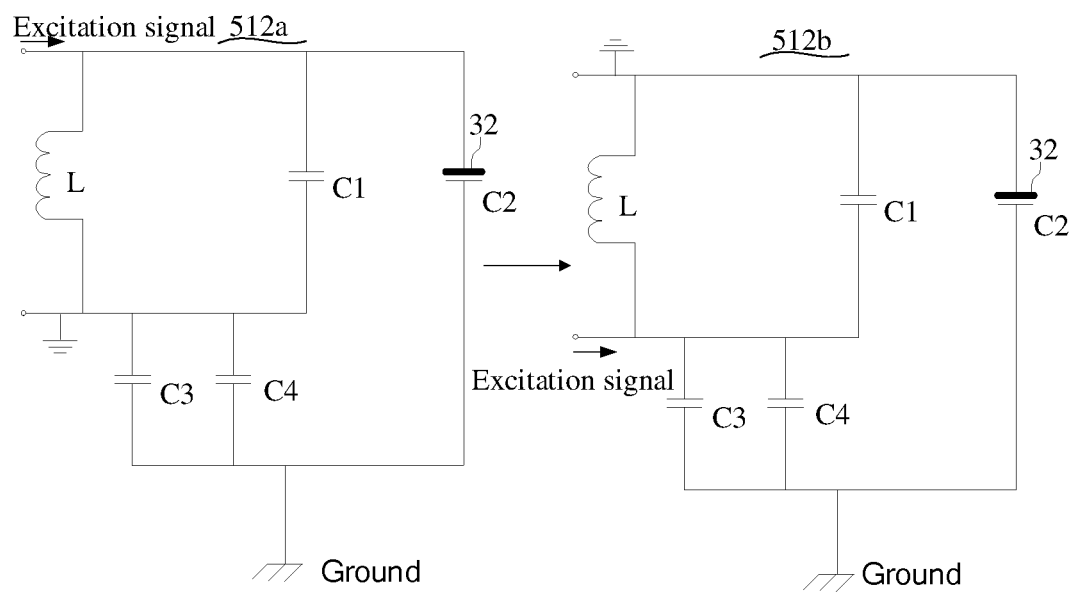
FIG. 23 is a schematic diagram of another equivalent circuit of a first oscillatory circuit and a second oscillatory circuit provided by an embodiment of the present disclosure.

Please refer to FIGS. 19 to 24, FIG. 19 is a schematic diagram of a circuit structure of a sensing circuit provided by an embodiment of the present disclosure: FIG. 20 is a schematic diagram of an equivalent circuit of an oscillatory circuit under a single oscillation mode provided by an embodiment of the present disclosure: FIG. 21 is a schematic diagram of another equivalent circuit of an oscillatory circuit under a single oscillation mode provided by an embodiment of the present disclosure: FIG. 22 is a schematic diagram of an equivalent circuit of a first oscillatory circuit and a second oscillatory circuit under a double oscillation mode provided by an embodiment of the present disclosure: FIG. 23 is a schematic diagram of another equivalent circuit of a first oscillatory circuit and a second oscillatory circuit provided by an embodiment of the present disclosure: FIG. 24 is a schematic diagram of a step-down circuit provided by the embodiment of the present disclosure.

Please refer to FIG. 19, which is a schematic diagram of a circuit structure of a sensing circuit provided by an embodiment of the present disclosure. The sensing circuit 51 comprises an oscillatory circuit 512, a detection circuit 210, and a connecting terminal 514. The oscillatory circuit 512 and the detection circuit 210 are jointly coupled to the connecting terminal 514, and the connecting terminal 514 is coupled to the electrode 120 located in the electronic skin 30. The oscillatory circuit 512 is coupled to the electrode 120 through the connecting terminal 514 to change its oscillation frequency when the external conductor approaches the electrode 120 to form a capacitor. The detection circuit 210 is coupled to the oscillatory circuit 512 to detect the oscillation frequency of the oscillatory circuit 512 and output electrical signals representing the oscillation frequency.

In some embodiments, the oscillatory circuit 512 oscillates in a single oscillation mode, and the detection circuit 210 may measure the oscillation frequency of the oscillatory circuit 512. Please refer to FIG. 20, which is a schematic diagram of an equivalent circuit of an oscillatory circuit under a single oscillation mode provided by an embodiment of the present disclosure.

Specifically, the oscillatory circuit 512 may comprise an inductor L and a first capacitor C1, and the inductor L and the first capacitor C1 constitute an oscillatory circuit. The oscillatory circuit 512 may be an LC parallel resonance circuit or an LC series resonance circuit. The oscillatory circuit 512 is coupled to the detection circuit 210, and the detection circuit 210 is configured to output excitation signals to the oscillatory circuit during the oscillation period. Specifically, the excitation signals may be output to the first end of the first capacitor C1 during the oscillation period. The first end of the first capacitor C1 is coupled to the connecting terminal 514, and is coupled to the electrode 120 of the electronic skin 30 through the connecting terminal 514. Through the above method, the excitation signal output by the detection circuit 210 may be always output to the first end of the first capacitor C1, so that the oscillatory circuit 512 oscillates in a single oscillation mode, and the detection circuit 210 detects the oscillation frequency or a change in oscillation frequency of the oscillatory circuit 512. Optionally, the capacitance of the first capacitor C1 is in the range of 15-40 pF.

When the distance between the electrode 120 and the external conductor is less than a certain range, the electrode 120 and the external conductor constitute a second capacitor C2. The second capacitor C2 is connected to the oscillatory circuit 512, which changes the equivalent capacitance value of the oscillatory circuit 512, and thus changing the oscillation frequency of the oscillatory circuit. In this way, the change of the oscillation frequency is associated with the second capacitor C2. Since the first capacitor C1 and the inductor L are known, the second capacitor C2 or the data related to the distance between the external conductor and the electrode 120 may be determined.

Referring to FIG. 20, which is a schematic diagram of an equivalent circuit of an oscillatory circuit under a single oscillation mode provided by an embodiment of the present disclosure. A case for the single-oscillation implementation is that the second end of the first capacitor C1 is grounded.

Its entire oscillation period is: $T = 2\pi\sqrt{L(C_1+C_2)}$.

The oscillation frequency detected by the detection circuit 210 is:

$$f_s = \frac{1}{T} = \frac{1}{2\pi\sqrt{L(C_1+C_2)}}.$$

Referring to FIG. 21, which is a schematic diagram of another equivalent circuit of an oscillatory circuit under a single oscillation mode provided by an embodiment of the present disclosure. For another case of the single oscillation implementation, the oscillatory circuit 512 may comprise a third capacitor C3 and a fourth capacitor C4. The capacitor of the grounding terminal of the sensing circuit 51 to ground constitutes a third capacitor C3. The capacitor of which the grounding terminal is coupled to the mechanical equipment constitutes a fourth capacitor C4. The fourth capacitor C4 is, for example, a capacitor generated when the grounding terminal is coupled to the main metal conductor of the mechanical equipment (e.g., a metal bracket, a joint bracket, or other additional metal plates). The fourth capacitor C4 is much larger than the third capacitor C3. Because the second end of the first capacitor C1 is grounded (signal ground) in this way, the grounding terminal of the sensing circuit 51 may be coupled to the second end of the first capacitor C1, or the second end of the second capacitor C2 may be configured as the grounding terminal of the sensing circuit 51. In this embodiment, except for the explicit description of being grounded, the rest of the grounds are coupling signal grounds or power grounds. For example, the determination process of the frequency of single resonance in this case may be as follows:

$$C_{comb} = \frac{C_2 C_3}{C_2 + C_3} = \beta C_2$$

$$\beta = \frac{1}{1 + \frac{C_2}{C_3}}$$

Since the grounding terminal is connected to the metal frame, it is equivalent to connecting a large capacitor in parallel with the third capacitor C3, that is, the third capacitor C3 and the fourth capacitor C4 are connected in parallel, which actually increases the equivalent capacitance of the third capacitor C3. That is, the above formula becomes, $$C_{comb} = \frac{(C_3 + C_4) \times C_2}{C_3 + C_4 + C_2} = \beta C_2, \beta = \frac{1}{1 + \frac{C_2}{C_3 + C_4}},$$

so the above $\beta \approx 1$.

In the first half of the oscillation period:

$$T_1 = \pi\sqrt{L(C_1 + C_{comb})} = \pi\sqrt{LC_1\left(1 + \frac{\beta C_2}{C_1}\right)}.$$

In the second half of the oscillation period: $T_2 = T_1$.

The oscillation frequency detected by the detection circuit 210 is:

$$f_s = \frac{1}{2T_1} = \frac{1}{2\pi\sqrt{LC_1\left(1 + \frac{\beta C_2}{C_1}\right)}}.$$

Wherein $T_1$ is the first half period of the oscillation period, $T_2$ is the second half period of the oscillation period, $C_{comb}$ is the equivalent capacitance, and $\beta$ is the capacitance coefficient.

Since L and C1 are definite and $\beta \approx 1$, $f_s$ is detected by the detection circuit 210, so $f_s$ is also determined, and C2 may be determined according to the above formula.

In other embodiments, the oscillatory circuit 512 oscillates in a dual oscillation mode, and the detection circuit 210 may measure the oscillation frequency of the oscillatory circuit 512.

The sensing circuit 51 may comprise a switching circuit, and the switching circuit is coupled to the oscillatory circuit 512. The oscillatory circuit 512 comprises an inductor L and a first capacitor C1 constituting the oscillatory circuit. The oscillatory circuit 512 may be an LC parallel resonance circuit or an LC series resonance circuit.

The oscillatory circuit 512 may comprise a first oscillatory circuit 512a and a second oscillatory circuit 512b. In some cases, the first oscillatory circuit 512a and the second oscillatory circuit 512b may be regarded as two states of the oscillatory circuit 512. The electrode 120 may belong to the first oscillatory circuit 512a or the second oscillatory circuit 512b, and the switching circuit may alternately switch the first oscillatory circuit 512a and the second oscillatory circuit 512b. There are many circumstances for switching between first oscillatory circuit 512a and second oscillatory circuit 512b, as shown below:

In the first case, the switching circuit may achieve the switching between the first oscillatory circuit 512a and the second oscillatory circuit 512b by switching the connection position of the electrode 120 and the oscillatory circuit 512. Please refer to FIG. 22, which is a schematic diagram of an equivalent circuit of a first oscillatory circuit and a second oscillatory circuit under a double oscillation mode provided by an embodiment of the present disclosure.

The switching circuit couples the electrode 120 to the first end of the first capacitor C1 during the first half of the oscillation period, so that the first capacitor C1 and the electrode 120 are connected in series with the second capacitor C2 constituted by the external conductor. The inductor, the first capacitor C1 and the electrode 120 constitute the first oscillatory circuit 512a. That is, the electrode 120 is coupled to the first end of the first capacitor C1 in the first half of the oscillation period, and they may be specifically coupled through the connecting terminal 514. The inductor, the first capacitor C1 and the electrode 120 constitute the first oscillatory circuit 512a. For example, the detection circuit 210b may output the excitation signals to the first end of the first capacitor C1, so that the capacitance signals generated by the second capacitor C2 constituted by the electrode 120 and the external conductor may affect the equivalent capacitance value of the oscillatory circuit 512, and the inductor L, the first capacitor C1, and the electrode 120 constitute the first oscillatory circuit 512a.

The switching circuit couples the electrode 120 to the second end of the first capacitor C1 in the second half of the oscillation period, so that the oscillatory circuit 512 does not include the electrode 120, the inductor L and the first capacitor C1 constitute the second oscillatory circuit 512b. That is, the electrode 120 is coupled to the second end of the first capacitor in the second half of the oscillation period, and they may be specifically coupled through the connecting terminal 514. The oscillatory circuit 512 does not include the electrode 120. For example, the detection circuit 210 may output the excitation signals to the first end of the first capacitor C1, and the second end of the first capacitor C1 is grounded. Therefore, the electrode 120 is equivalent to grounding, and it cannot affect the equivalent capacitance of the oscillatory circuit 512, that is, the oscillatory circuit 512 does not include the electrode 120, and the second oscillatory circuit 512 is constituted by an inductor and a first capacitor C1.

In this case, the second end of the first capacitor C1 is grounded and may be coupled to the grounding terminal of the sensing circuit 51, or the second end of the first capacitor C1 may be used as the grounding terminal of the sensing circuit 51.

In the second case, the switching circuit realizes the switching between the first oscillatory circuit 512a and the second oscillatory circuit 512b at the output position of the oscillatory circuit 512 by switching the excitation signal output by the detection circuit 210. Please refer to FIG. 23, which is a schematic diagram of another equivalent circuit of a first oscillatory circuit and a second oscillatory circuit provided by an embodiment of the present disclosure.

The electrode 120 is coupled to the first end of the first capacitor C1 and is used to constitute a second capacitor C2 with an external conductor. In this case, the connection relationship between the electrode 120 and the first end of the first capacitor C1 may be stable. The switching circuit outputs the excitation signals output by the detection circuit 210 to the first end of the first capacitor C1 during the first half of the oscillation period, the second end of the first capacitor C1 is grounded, and the inductor L, the first capacitor C1 and the electrode 120 constitute the first oscillatory circuit 512a. In this way, the capacitance signal generated by the capacitor constituted by the external conductor and the electrode 120 will affect the equivalent capacitance of the oscillatory circuit 512, and the inductor L, the first capacitor C1 and the electrode 120 constitute the first oscillatory circuit 512a.

The switching circuit outputs the excitation signal output by the detection circuit 210 to the second end of the first capacitor C1 in the second half of the oscillation period, and the first end of the first capacitor C1 is grounded, so that the oscillatory circuit 512 does not include the electrode 120, and the inductor and the first capacitor C1 constitute the second oscillatory circuit 512. In this way, the electrode 120 is grounded through the first end of the first capacitor C1, which cannot affect the equivalent capacitance of the oscillatory circuit 512, so that the oscillatory circuit 512 does not include the electrode 120, and the inductor L and the first capacitor C1 constitute the second oscillatory circuit 512b.

In this case, the first end of the first capacitor C1 is grounded and may be coupled to the grounding terminal of the sensing circuit 51, or the first end of the first capacitor C1 may be used as the grounding terminal of the sensing circuit 51.

For the first and second cases above, the oscillatory circuit 512 includes a third capacitor C3 and a fourth capacitor C4. The grounding terminal of the sensing circuit 51 constitutes a third capacitor C3 against the capacitance of the ground. The capacitor coupled to the grounding terminal on the mechanical equipment constitutes the fourth capacitor C4. The fourth capacitor C4 is, for example, a capacitor generated when the grounding terminal is coupled to the main metal conductor of the mechanical equipment (such as a metal bracket, a joint bracket, or other additional metal plates). The fourth capacitor C4 is much larger than the third capacitor C3.

For example, the determination process of the oscillation frequency in the above two cases maybe as follows:

$$C_{comb} = \frac{(C_3 + C_4) \times C_2}{C_3 + C_4 + C_2} = \beta C_2, \beta = \frac{1}{1 + \frac{C_2}{C_3 + C_4}}.$$

Since the grounding terminal is connected to the metal frame, it is equivalent to connecting a large capacitor in parallel with the third capacitor C3, that is, the third capacitor C3 and the fourth capacitor C4 are connected in parallel, which in fact increases the equivalent capacitance of the third capacitor C3. Therefore, the above β≈1.

In the first half of the oscillation period:

$$T_1 = \pi\sqrt{L(C_1 + C_{comb})} = \pi\sqrt{LC_1\left(1 + \frac{\beta C_2}{C_1}\right)}.$$

In the second half of the oscillation period: $T_2 = \pi\sqrt{LC_1}$.

The oscillation frequency $f_s$ detected by the detection circuit 210 is:

$$f_s = \frac{1}{T_1 + T_2} = \frac{1}{\pi\sqrt{LC_1}\left(1 + \sqrt{1 + \frac{\beta C_2}{C_1}}\right)}.$$

Since L and C1 are definite, β≈1 and $f_s$ is detected by the detection circuit 210, $f_s$ is also definite, so C2 may be determined according to the above formula.

For C2 determined from the oscillation frequency $f_s$ detected by the above single resonance and double oscillation modes, for example, the distance between the conductor and the electrode 120 may be further determined as follows.

The distance d between the electrode 120 and the external conductor determined by C2:

$$C_2 = \frac{\varepsilon S}{4\pi k d}.$$

Wherein T1 is the first half period of the oscillation period, $T_2$ is the second half period of the oscillation period, $C_{comb}$ is the equivalent capacitance, B is the capacitance coefficient, ε is the dielectric constant, S is the front area of the electrode 120 and the external conductor, and k is the electrostatic force constant.

Wherein one pole of the first capacitor C1 is the electrode 120 in the housing 100 or the housing assembly 200.

For the housing 500 provided in this embodiment, by arranging the electrode 520 on the main body 510, the electrode 520 and a conductor that approaches the electrode 520 generate a capacitance, and the capacitance detection circuit or charge detection circuit connected to the capacitor may detect the electrical signals representing the amount of charge of capacitor, the oscillation frequency or a change in oscillation frequency, so that the housing 500 of the mechanical equipment is capable of sensing the approaching of the external conductor and realizing non-contact distance sensing.

In summary, for the housing provided in the present disclosure, by arranging the electrode on the body, and the sensing area of the electrode is capable of constituting a capacitor with the approaching conductor, and the connection area connected to the sensing area is configured to transmit the electrical signals representing the capacitance or a change in the capacitance to the peripheral circuit so as to obtain the distance between the electrode and the conductor or a change of the distance between the electrode and the conductor, so that the housing of mechanical equipment may sense the approaching of the external conductor and realize non-contact distance sensing.

The above description is only embodiments of the present disclosure and does not limit the scope of the present disclosure. Any equivalent structure or equivalent process transformation made based on the description and drawings of the present disclosure, or directly or indirectly applied to other related arts, shall fall into the scope of patent protection of the present disclosure.

The invention claimed is:

1. A housing, comprising:
   a main body;
   electrodes, wherein each electrode is arranged on the main body and comprises a sensing area and a connection area that are interconnected, the sensing area of the electrode and a conductor that approaches the sensing area generate a capacitor, and the connection area of the electrode is configured to transmit an electrical signal representing a capacitance of the capacitor or a change in the capacitance of the capacitor to a peripheral circuit,
   wherein each of the electrodes is configured to generate one and only one electrical signal representing the capacitance of the capacitor or the change in the capacitance, and
   wherein the electrodes comprise a first electrode and a second electrode, and each electrode comprises a plurality of edges; the connection area of the first electrode is disposed at first edge of the plurality of edges of the first electrode adjacent to the second electrode, the connection area of the second electrode is disposed at a second edge of the plurality of edges of the second electrode adjacent to the first electrode; and the peripheral circuit is disposed at a middle portion of the connection area of the first electrode and the connection area of the second electrode;
   the first edge of the first electrode is an edge that directly faces the second electrode, the second edge of the second electrode is an edge that directly faces the first electrode;
   the connection area of the first electrode has a first orthographic projection on the first electrode, projecting along a direction perpendicular to the first edge;
   the connection area of the second electrode has a second orthographic projection on the first electrode, projecting along the direction perpendicular to the first edge; and
   the first projection at least partially overlaps with the second projection.

2. The housing according to claim 1, wherein the housing comprises at least two electrodes, the at least two electrodes are laid flat on an outer surface of the main body to enclose the outer surface of the main body together, and both two adjacent electrodes are separated and insulated from each other.

3. The housing according to claim 2, wherein the at least two electrodes are arranged in array or distributed disorderly on the main body.

4. The housing according to claim 1, wherein the housing comprises at least two electrodes, the at least two electrodes are laid flat on an outer surface of the main body dispersedly, and every two adjacent electrodes are separated and insulated from each other.

5. The housing according to claim 1, wherein the main body comprises an end portion, there are at least three electrodes, wherein at least two of the electrodes are enclosed and distributed circumferentially around the main body, and at least another electrode is distributed on a side of end portion of the main body.

6. The housing according to claim 1, wherein the main body is an insulator, and the electrode is coated on the main body or embedded in the main body.

7. The housing according to claim 6, wherein the housing comprises a shielding layer, wherein the shielding layer is located inside the main body, and is arranged to be opposite to the electrode, and has an area that is no less than an area of the corresponding electrode.

8. The housing according to claim 1, wherein the main body is a conductor, the electrode is located at the outer surface of the main body, and an insulating layer is arranged between the main body and the electrode.

9. A housing assembly, comprising a housing and a detection circuit, wherein the housing comprises a main body and an electrode, the electrode is arranged on the main body, and the electrode and a conductor that approaches the electrode generate a capacitance, and the electrode is configured to be connected with a capacitance detection circuit or a charge detection circuit; the detection circuit is arranged on the housing and is connected with the electrode, and is configured to transmit an electrical signal representing a value of the capacitance or a change in the value of the capacitance to a peripheral circuit, wherein the electrode is configured to generate one and only one electrical signal representing the value of the capacitance or the change in the value of the capacitance, and wherein the electrodes comprise a first electrode and a second electrode, and each electrode comprises a plurality of edges; the connection area of the first electrode is disposed at a first edge of the plurality of edges of the first electrode adjacent to the second electrode, the connection area of the second electrode is disposed at a second edge of the plurality of edges of the second electrode adjacent to the first electrode; and the peripheral circuit is disposed at a middle portion of the connection area of the first electrode and the connection area of the second electrode;

the first edge of the first electrode is an edge that directly faces the second electrode, the second edge of the second electrode is an edge that directly faces the first electrode;

the connection area of the first electrode has a first orthographic projection on the first electrode, projecting along a direction perpendicular to the first edge;

the connection area of the second electrode has a second orthographic projection on the first electrode, projecting along the direction perpendicular to the first edge; and the first projection at least partially overlaps with the second projection.

10. The housing assembly according to claim 9, wherein the detection circuit comprises a detection circuit board, the detection circuit board is configured to be fixed inside the housing or embedded in the housing, and a part of the main body between the electrode and the detection circuit board is provided with a via hole, and the detection circuit board is connected with the electrode through the via hole.

11. The housing assembly according to claim 10, wherein the detection circuit board is a multi-channel circuit board having multiple detection input terminals, there are multiple electrodes, and each of the detection input terminals is connected with one of the electrodes, respectively.

12. The housing assembly according to claim 11, wherein the connection areas of the electrodes adjacent to each other are arranged to be adjacent to each other, and the detection circuit board is located in an area where the connection areas are located.

13. The housing assembly according to claim 9, wherein the peripheral circuit is a processor which is located on the housing, and is configured to process the electrical signal so as to obtain a distance between the electrode and the conductor or a change of the distance between the electrode and the conductor.

14. A mechanical arm, comprising a main part, at least one joint module connected to the main part, and a detection circuit, wherein:

the main part and/or the joint module comprises a housing, the housing comprises a main body and electrodes, each electrode is arranged on the main body, and the electrode and a conductor that approaches the electrode generate a capacitance, the electrode is configured to be connected with a capacitance detection circuit or a charge detection circuit and the detection circuit is electrically connected with the electrode, the electrode is configured to generate one and only one electrical signal, which represents a value of the capacitance or a change in the value of the capacitance, to a periphery circuit, and the electrodes comprise a first electrode and a second electrode, and each electrode comprises a plurality of edges; the connection area of the first electrode is disposed at a first edge of the plurality of edges of the first electrode adjacent to the second electrode, the connection area of the second electrode is disposed at a second edge of the plurality of edges of the second electrode adjacent to the first electrode; and the peripheral circuit is disposed at a middle portion of the connection area of the first electrode and the connection area of the second electrode;

the first edge of the first electrode is an edge that directly faces the second electrode, the second edge of the second electrode is an edge that directly faces the first electrode;

the connection area of the first electrode has a first orthographic projection on the first electrode, projecting along a direction perpendicular to the first edge;

the connection area of the second electrode has a second orthographic projection on the first electrode, projecting along the direction perpendicular to the first edge; and the first projection at least partially overlaps with the second projection.

15. The mechanical arm according to claim 14, wherein the main part and the joint module comprise a hollow frame, and the housing is sleeved on an outer surface of the hollow frame.

16. The mechanical arm according to claim 15, wherein the detection circuit comprises a detection circuit board, and the detection circuit board is arranged to be fixed inside the housing, be embedded in the housing, be fixed at the outer surface of the hollow frame or located in the hollow frame, and the detection circuit board is connected to the electrode.

17. The mechanical arm according to claim 15, wherein a shape of the electrode is arranged to match with the shape of the main body, and a shape of the housing is arranged to match with a shape of the hollow frame.

18. The mechanical arm according to claim 15, wherein there is space between the housing and the hollow frame, and a leading-out terminal of the detection circuit board is configured to be connected with a control circuit of the mechanical arm through a data cable, and the space between the housing and the hollow frame is configured to receive the data cable.

19. The mechanical arm according to claim 14, further comprising a control circuit, the control circuit is connected to the detection circuit, and is configured to be responsive upon the distance between the electrode and the conductor or a change in distance between the electrode and the conductor meets a predetermined condition.

20. A housing, comprising:
a main body; and
electrodes, wherein each electrode is arranged on the main body, the electrode and a conductor that approaches the electrode generate a capacitance, and the electrode is configured to be connected with a capacitance detection circuit or a charge detection circuit,
wherein the electrode is configured to generate one and only one electrical signal, which represents a value of the capacitance or a change in the value of the capacitance, to a periphery circuit, and
wherein the electrodes comprise a first electrode and a second electrode, and each electrode comprises a plurality of edges; the connection area of the first electrode is disposed at a first edge of the plurality of edges of the first electrode adjacent to the second electrode, the connection area of the second electrode is disposed at a second edge of the plurality of edges of the second electrode adjacent to the first electrode; and the peripheral circuit is disposed at a middle portion of the connection area of the first electrode and the connection area of the second electrode;
the first edge of the first electrode is an edge that directly faces the second electrode, the second edge of the second electrode is an edge that directly faces the first electrode;
the connection area of the first electrode has a first orthographic projection on the first electrode, projecting along a direction perpendicular to the first edge;
the connection area of the second electrode has a second orthographic projection on the first electrode, projecting along the direction perpendicular to the first edge; and
the first projection at least partially overlaps with the second projection.

* * * * *